(12) United States Patent
Kim et al.

(10) Patent No.: US 11,487,615 B2
(45) Date of Patent: Nov. 1, 2022

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Kiheung Kim, Suwon-si (KR); Hyungi Kim, Anyang-si (KR); Junhyung Kim, Suwon-si (KR); Sungchul Park, Seoul (KR); Yesin Ryu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 17/205,276

(22) Filed: Mar. 18, 2021

(65) Prior Publication Data

US 2022/0050748 A1 Feb. 17, 2022

(30) Foreign Application Priority Data

Aug. 13, 2020 (KR) ........................ 10-2020-0101480

(51) Int. Cl.
*G06F 11/10* (2006.01)
*G11C 11/4096* (2006.01)
*G11C 11/406* (2006.01)
*G11C 11/408* (2006.01)
*H01L 25/065* (2006.01)

(52) U.S. Cl.
CPC ........ *G06F 11/1068* (2013.01); *G06F 11/106* (2013.01); *G11C 11/4087* (2013.01); *G11C 11/4096* (2013.01); *G11C 11/40611* (2013.01); *H01L 25/0657* (2013.01); *H01L 2225/06541* (2013.01)

(58) Field of Classification Search
CPC ............... G06F 11/1068; G06F 11/106; G11C 11/40611; G11C 11/4087; G11C 11/4096; H01L 25/0657; H01L 2225/06541
See application file for complete search history.

(56) References Cited

U.S. PATENT DOCUMENTS

| | | | |
|---|---|---|---|
| 8,443,262 B2 | 5/2013 | Foley | |
| 8,549,366 B2 | 10/2013 | Higeta et al. | |
| 10,037,244 B2 | 7/2018 | Chung et al. | |
| 10,586,584 B2 | 3/2020 | Cha et al. | |

(Continued)

*Primary Examiner* — Kyle Vallecillo
(74) *Attorney, Agent, or Firm* — Harness, Dickey & Pierce, P.L.C.

(57) ABSTRACT

A semiconductor memory device includes a memory cell array, an error correction code (ECC) engine, a scrubbing control circuit and a control logic circuit. The memory cell array includes memory cell rows, and each of the memory cell rows including volatile memory cells. The scrubbing control circuit generates scrubbing addresses for performing a normal scrubbing operation on the memory cell rows with a first period based on refresh row addresses for refreshing the memory cell rows. The control logic circuit controls the ECC engine the scrubbing control circuit to distribute a scrubbing operation on weak codewords dynamically within the refresh operation such that a dynamic allocated scrubbing (DAS) operation is performed with a second period smaller than the first period. An error bit is detected in each of the weak codewords during the normal scrubbing operation or normal read operation on at least one of the memory cell rows.

20 Claims, 22 Drawing Sheets

(56) References Cited

U.S. PATENT DOCUMENTS

| | | |
|---|---|---|
| 10,599,504 B1 | 3/2020 | BeSerra et al. |
| 10,607,680 B2 | 3/2020 | Jin et al. |
| 10,613,928 B2 | 4/2020 | Kim et al. |
| 10,635,535 B2 | 4/2020 | Cha et al. |
| 10,671,478 B2 | 6/2020 | Cha et al. |
| 2007/0022244 A1 | 1/2007 | Kimmery |
| 2017/0139641 A1* | 5/2017 | Cha ........................ G06F 11/106 |
| 2018/0150350 A1* | 5/2018 | Cha ........................ G06F 11/1016 |
| 2019/0188072 A1* | 6/2019 | Kim ........................ G06F 11/104 |
| 2019/0243708 A1* | 8/2019 | Cha ........................ G11C 29/52 |

* cited by examiner

SEMICONDUCTOR MEMORY DEVICES AND METHODS OF OPERATING SEMICONDUCTOR MEMORY DEVICES

CROSS-REFERENCE TO RELATED APPLICATIONS

This application claims the benefit of priority under 35 USC § 119 to Korean Patent Application No. 10-2020-0101480, filed on Aug. 13, 2020, in the Korean Intellectual Property Office, the disclosure of which is incorporated by reference in its entirety herein.

BACKGROUND

The present disclosure relates to memories, and more particularly to semiconductor memory devices and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrinking of the fabrication design rule of DRAMs, bit errors of memory cells in the DRAMs may increase and/or yield of the DRAMs may decrease.

SUMMARY

Example embodiments may provide a more credible semiconductor memory device.

According to example embodiments, a semiconductor memory device includes a memory cell array, an error correction code (ECC) engine, a scrubbing control circuit and a control logic circuit. The memory cell array includes a plurality of memory cell rows, and each of the plurality of memory cell rows including volatile memory cells. The scrubbing control circuit generates scrubbing addresses for performing a normal scrubbing operation on the plurality of memory cell rows with a first period based on refresh row addresses for refreshing the plurality of memory cell rows. The control logic circuit controls the ECC engine the scrubbing control circuit to distribute a scrubbing operation on weak codewords dynamically within a refresh operation such that a dynamic allocated scrubbing (DAS) operation is performed with a second period smaller than the first period. An error bit is detected in each of the weak codewords during the normal scrubbing operation or normal read operation on at least one of the plurality of memory cell rows.

According to example embodiments, in a method of operating a semiconductor memory device including a memory cell array that includes a plurality of memory cell rows and each of the plurality of memory cell rows including a plurality of volatile memory cells, scrubbing addresses for performing a normal scrubbing operation on the plurality of memory cell rows are generated by a scrubbing control circuit based on refresh row addresses for refreshing the plurality of memory cell rows, addresses of weak codewords are stored by an error correction code (ECC) engine in an address storing table of the scrubbing control circuit while the ECC engine performs a normal scrubbing operation on the memory cell rows based on the scrubbing addresses with a first period, and a dynamic allocated scrubbing (DAS) operation is performed by the ECC engine on the weak codewords with a second period smaller than the first period based on a scrubbing operation on the weak codewords being dynamically within the refresh operation. An error bit is detected in each of the weak codewords during the normal scrubbing operation or normal read operation on at least one of the plurality of memory cell rows.

According to example embodiments, a semiconductor memory device includes a memory cell array, an error correction code (ECC) engine, a refresh control circuit, a scrubbing control circuit and a control logic circuit. The memory cell array includes a plurality of memory cell rows, and each of the plurality of memory cell rows including volatile memory cells. The refresh control circuit generates refresh row addresses for refreshing the plurality of memory cell rows. The scrubbing control circuit generates scrubbing addresses for performing a normal scrubbing operation on the plurality of memory cell rows with a first period based on refresh row addresses. The control logic circuit controls the ECC engine the scrubbing control circuit to distribute a scrubbing operation on weak codewords dynamically within a refresh operation such that a dynamic allocated scrubbing (DAS) operation is performed with a second period smaller than the first period. An error bit is detected in each of the weak codewords during the normal scrubbing operation or normal read operation on at least one of the memory cell rows. The control logic circuit stores addresses of the weak codewords in an address storing table in the scrubbing control circuit as weak codeword addresses, and provides the scrubbing control circuit with a flag signal that triggers the DAS operation.

Accordingly, the semiconductor memory device includes an ECC engine and a scrubbing control circuit. The ECC engine and the scrubbing control circuit perform a normal scrubbing operation within a first period based on refresh addresses. The ECC engine and the scrubbing control circuit dynamically distributes scrubbing operation on the weak codewords in which an error bit is detected within the refresh operation during the normal scrubbing operation or a normal read operation and performs a DAS operation on a second period smaller than the first period. Therefore, the semiconductor memory device may enhance credibility and/or performance by reducing or preventing error bits from being accumulated.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
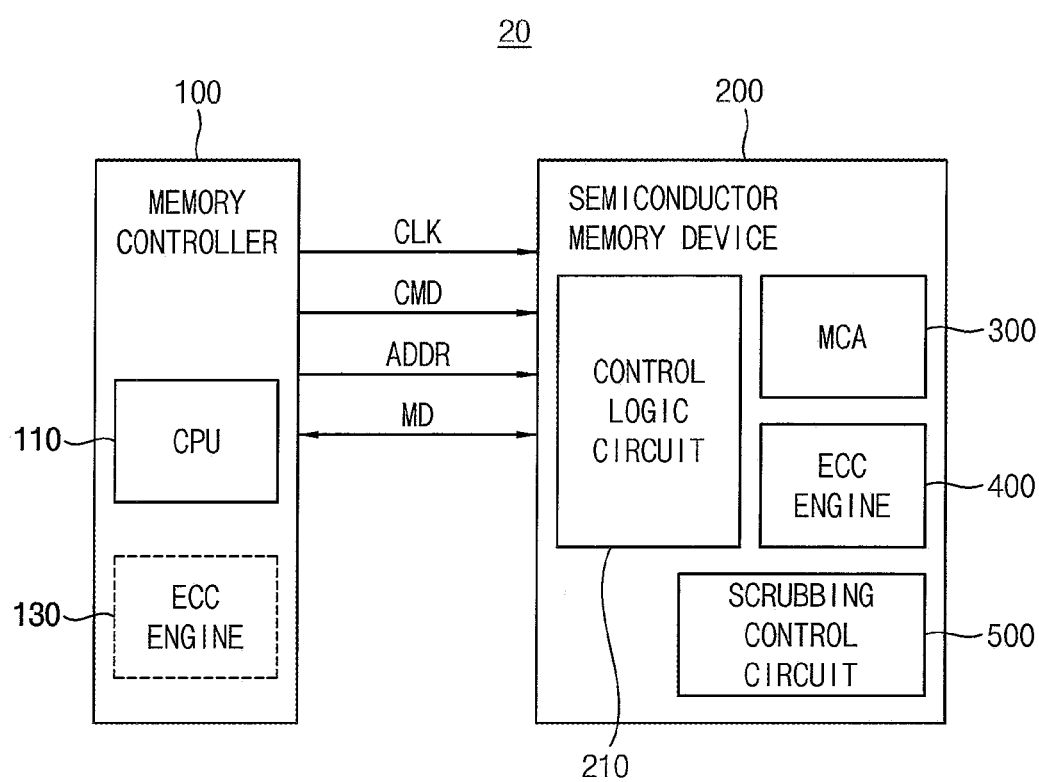
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and/or a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, a LPDDR5 SDRAM or a LPDDR6 SDRAM.

The memory controller 100 may transmit a clock signal CLK, a command CMD, and/or an address (signal) ADDR to the semiconductor memory device 200 and exchanges main data MD with the semiconductor memory device 200. The memory controller 100 transmits a write data to the semiconductor memory device 200 and receives a read data from the semiconductor memory device 200.

The semiconductor memory device 200 may include a memory cell array 300 that stores the main data MD and parity bits generated based on the main data MD, an error correction code (ECC) engine 400, a control logic circuit 210 and a scrubbing control circuit 500.

The ECC engine 400 may perform ECC encoding on a write data to be stored in a target page of the memory cell array 300, and may perform ECC decoding or decoding on a codeword read from the target page under control of the control logic circuit 210.

The scrubbing control circuit 500 may generate scrubbing addresses such that scrubbing operation is performed on a selected memory cell row of a plurality of memory cell rows with a first period whenever refresh operation is performed on N memory cell rows when the refresh operation is performed on the plurality of memory cell rows included in the memory cell array 300. Here, N is a natural number greater than two.

The control logic circuit 210 may control the ECC engine 400 to perform a normal scrubbing operation such that the ECC engine 400 ECC engine reads data corresponding to a first codeword, from at least one sub-page, designated by the scrubbing address, in the selected memory cell row, corrects at least one error bit in the first codeword and writes back the corrected first codeword in a memory location in which the at least one sub-page is stored.

The ECC engine 400 may store addresses of weak codewords, in each of which an error bit is detected during the normal scrubbing operation, in an address storing table in the scrubbing control circuit 500.

The control logic circuit 200 may control the ECC engine 400 to distribute a scrubbing operation on the weak codewords dynamically within the refresh operation such that a dynamic allocated scrubbing (DAS) operation is performed with a second period smaller than the first period.

In some example embodiments, the memory controller 100 may include a central processing unit (CPU) 110. The CPU 110 may control overall operation of the memory controller 100. The memory controller 100 may further include an ECC engine 130 that detects an error bit in the data read from the semiconductor memory device 200 and corrects the error bit.

Figure 2:
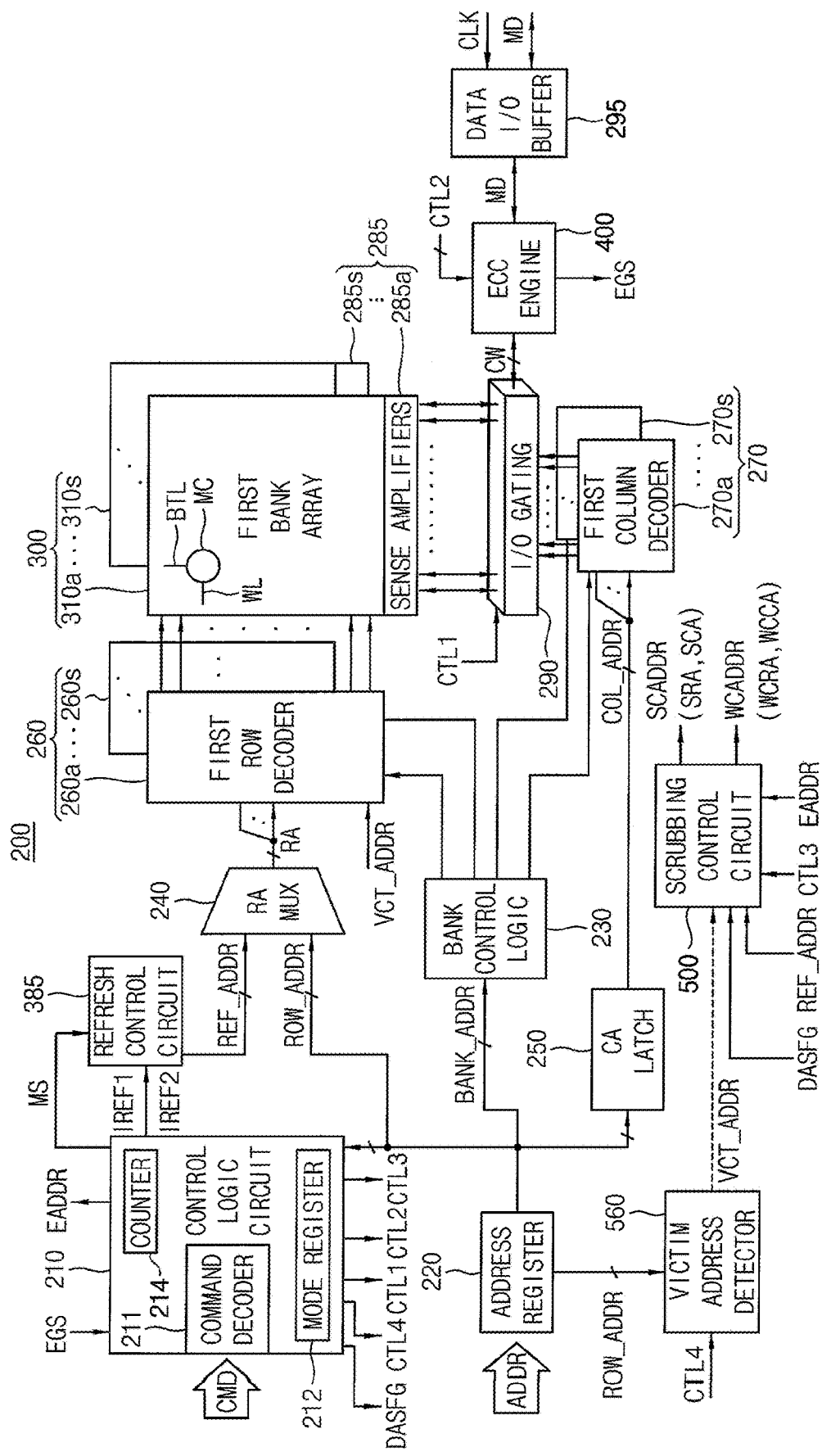
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 may include the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an input/output (I/O) gating circuit 290, the ECC engine 400, the scrubbing control circuit 500, a victim address detector 560, and/or a data I/O buffer 295.

The memory cell array 300 may include first through sixteenth bank arrays 310a~310s. The row decoder 260 may include first through sixteenth bank row decoders 260a~260s respectively coupled to the first through sixteenth bank arrays 310a~310s, the column decoder 270 may include first through sixteenth bank column decoders 270a~270s respectively coupled to the first through sixteenth bank arrays 310a~310s, and the sense amplifier unit 285 may include first through sixteenth bank sense amplifiers 285a~285s respectively coupled to the first through sixteenth bank arrays 310a~310s.

The first through sixteenth bank arrays 310a~310s, the first through sixteenth bank row decoders 260a~260s, the first through sixteenth bank column decoders 270a~270s and first through sixteenth bank sense amplifiers 285a~285s may form first through sixteenth banks. Each of the first through sixteenth bank arrays 310a~310s may include a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through sixteenth bank row decoders 260a~260s corresponding to the bank address BANK_ADDR is activated in response to the bank control signals, and one of the first through sixteenth bank column decoders 270a~270s corresponding to the bank address BANK_ADDR is activated in response to the bank control signals.

The row address multiplexer 240 receives the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the first through sixteenth bank row decoders 260a~260s.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may applies the first refresh control signal IREF1 to the refresh control circuit 385 whenever the control logic circuit 210 receives the auto refresh command. When the command CMD from the memory controller 100 corresponds to a self-refresh entry command, the control logic circuit 210 may applies the second refresh control signal IREF2 to the refresh control circuit 385 and the second refresh control signal IREF2 is activated from a time point when the control logic circuit 210 receives the self-refresh entry command to a time point when control logic circuit 210 receives a self-refresh exit command.

The refresh control circuit 385 may sequentially increase or decrease the refresh row address REF_ADDR in response to receiving the first refresh control signal IREF1 or during the second refresh control signal IREF2 is activated.

The activated one of the first through sixteenth bank row decoders 260a~260s, by the bank control logic 230, decodes the row address RA that is output from the row address multiplexer 240 or a target scrubbing row address TSRA, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some example embodiments, in a burst mode, the column address latch 250 generates column addresses that increment from the received column address COL_ADDR. The column address latch 250 applies the temporarily stored or generated column address to the first through sixteenth bank column decoders 270a~270s.

The activated one of the first through sixteenth bank column decoders 270a~270s activates a sense amplifier corresponding to the bank address BANK_ADDR and the column address COL_ADDR or a target scrubbing column address TSCA through the I/O gating circuit 290.

The I/O gating circuit 290 may include circuitry for gating input/output data, and further may include input data mask logic, read data latches for storing data that is output from the first through sixteenth bank arrays 310a~310s, and/or write drivers for writing data to the first through sixteenth bank arrays 310a~310s.

Codeword CW read from one bank array of the first through sixteenth bank arrays 310a~310s is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through sixteenth bank arrays 310a~310s may be provided to the data I/O buffer 295 from the memory controller 100, may be provided to the ECC engine 400 from the data I/O buffer 295, the ECC engine 400 may perform an ECC encoding on the main data MD to generate parity bits, the ECC engine 400 may provide the main data MD and the parity bits to the I/O gating circuit 290 and the I/O gating circuit 290 may write the main data MD and the parity bits in a sub-page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The scrubbing control circuit 500 may count the refresh row address REF_ADDR which sequentially changes and may output a normal scrubbing address SCADDR whenever the scrubbing control circuit 500 counts N refresh row addresses. Here, N is an integer greater than two. The normal scrubbing address SCADDR may include a scrubbing row address SRA and a scrubbing column address SCA.

The scrubbing control circuit 500 may provide the scrubbing row address SRA and the scrubbing column address SCA to the row decoder 260 and the column decoder 270, respectively in a first scrubbing mode. The ECC engine 400 may store addresses of the weak codewords in each of which an error bit is detected during a normal scrubbing operation.

The ECC engine 400 performs perform an ECC decoding on a codeword read from a sub-page of the target page in the normal scrubbing operation or a normal read operation and may provide an error generation signal EGS to the control logic circuit 210 with correcting at least one error bit when the at least one error bit is detected in the main data in the codeword. The control logic circuit 210 may store a row address and a column address of the codeword including the at least one error bit, in an address soring table in the scrubbing control circuit 500 as an error address EADDR.

In some example embodiments, the ECC engine 400 instead of the control logic circuit 210 may store directly the error address EADDR in the address storing table.

The ECC engine 400, during the DAS operation, perform an ECC decoding on a weak codeword from a weak sub-page, corrects at least one error bit in the weak codeword and writes back the corrected weak codeword in a memory location corresponding to the weak sub-page.

The victim address detector 560 may count a number of accesses to a first memory region in the memory cell array 300 to generate at least one victim address VCT_ADDR designating at least one adjacent memory region adjacent to the first memory region when the number of the counted accesses reaches the a reference value during a reference interval.

The victim address detector 560 may provide the at least one victim address VCT_ADDR to the row decoder 260 such that a target refresh operation is performed on the least one adjacent memory region. In some example embodiments, the victim address detector 560 may store the at least one victim address VCT_ADDR in the address storing table in the scrubbing control circuit 500.

The scrubbing control circuit 500, in a second scrubbing mode, may output an address of codeword associated with the error address EADDR or the victim address VCT_ADDR stored in the address storing table as a weak codeword address WCADDR in response to a flag signal DASFG from the control logic circuit. The weak codeword address WCADDR may include a weak codeword row address WCRA and a weak codeword column address WCCA. The scrubbing control circuit 500 may provide the weak codeword row address WCRA and the weak codeword column address WCCA to the row decoder 260 and the column decoder 270, respectively in the second scrubbing mode.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200. The control logic circuit 210 may include a counter 214 that counts the error generation signal EGS.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400, a third control signal CTL3 to control the scrubbing control circuit 500 and a fourth control signal CTL4 to control the victim address detector 560.

In addition, the control logic circuit 210 may provide the refresh control circuit 385 with a mode signal MS associated with a refresh period. The control logic circuit 210 may generate the mode signal MS based on a temperature signal representing an operating temperature of the semiconductor memory device 200. In addition, the control logic circuit 210 may provide the error address EADDR and the flag signal DASFG to the scrubbing control circuit 500.

Figure 3:
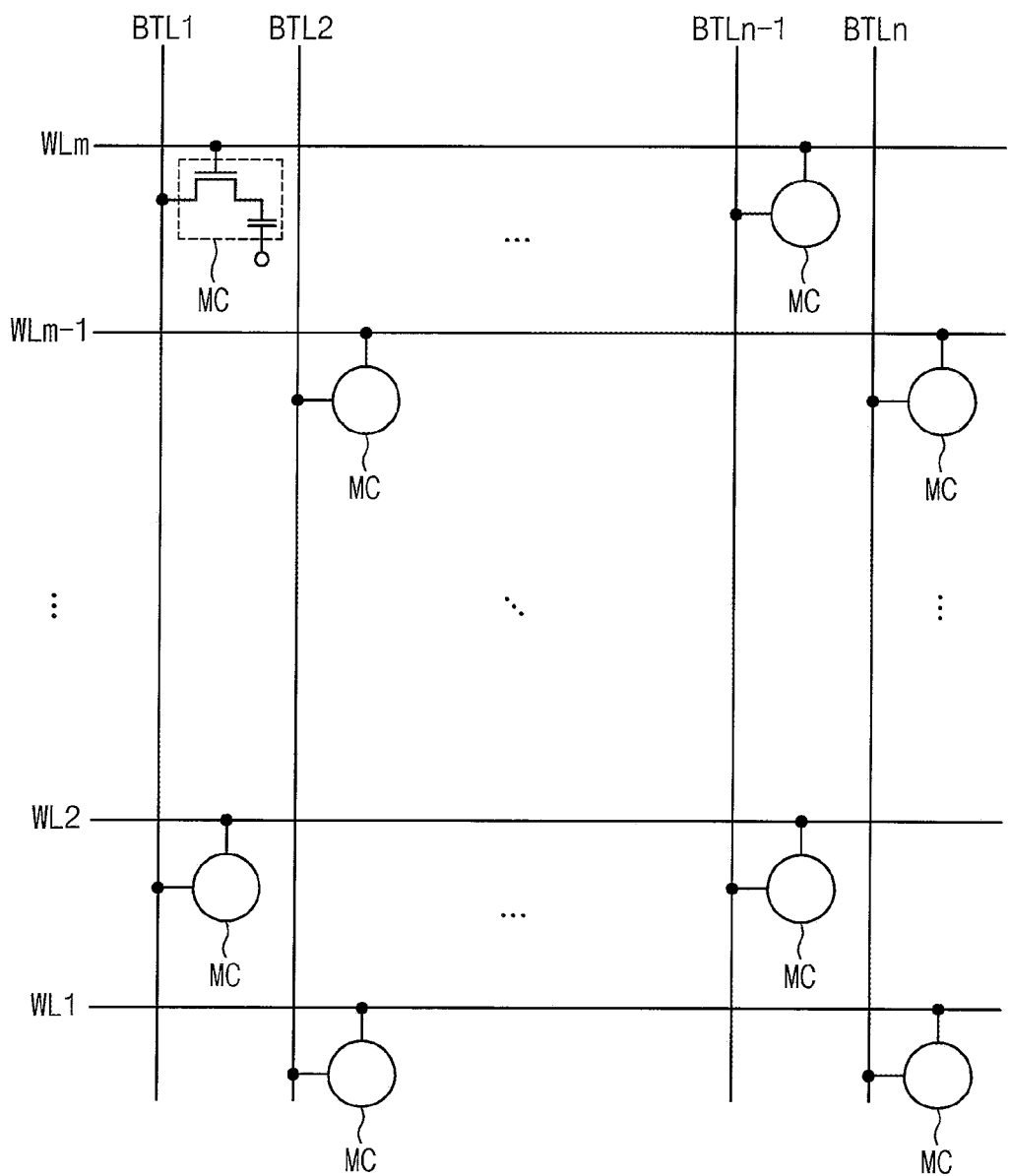
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 may include a plurality of word-lines WL1~WLm (m is a natural number greater than two), a plurality of bit-lines BTL1~BTLn (n is a natural number greater than two), and a plurality of volatile memory cells MCs disposed at intersections between the word-lines WL1~WLm and the bit-lines BTL1~BTLn. Each of the memory cells MCs may include a cell transistor coupled to each of the word-lines WL1~WLm and each of the bit-lines BTL1~BTLn and a cell capacitor coupled to the cell transistor.

Figure 4:
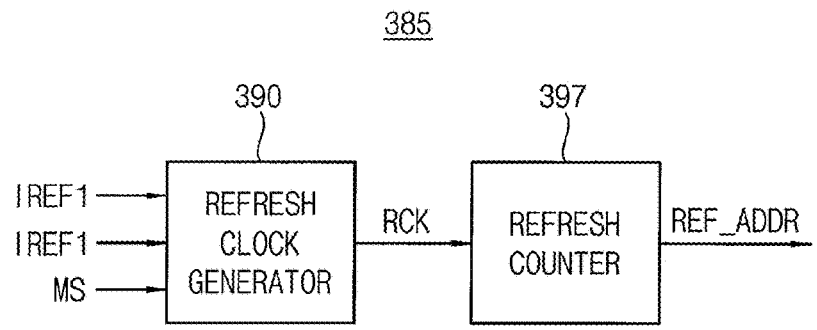
FIG. 4 is a block diagram illustrating the refresh control circuit in the semiconductor memory device of FIG. 2 according to example embodiments.

FIG. 4 is a block diagram illustrating an example of the refresh control circuit in the semiconductor memory device of FIG. 2 according to example embodiments.

Referring to FIG. 4, the refresh control circuit 385 may include a refresh clock generator 390 and/or a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or during the second refresh control signal IREF2 is activated.

The refresh counter 397 may generate the refresh row address REF_ADDR designating sequentially the memory cell rows by performing counting operation at the period of the refresh clock signal RCK.

Figure 5:
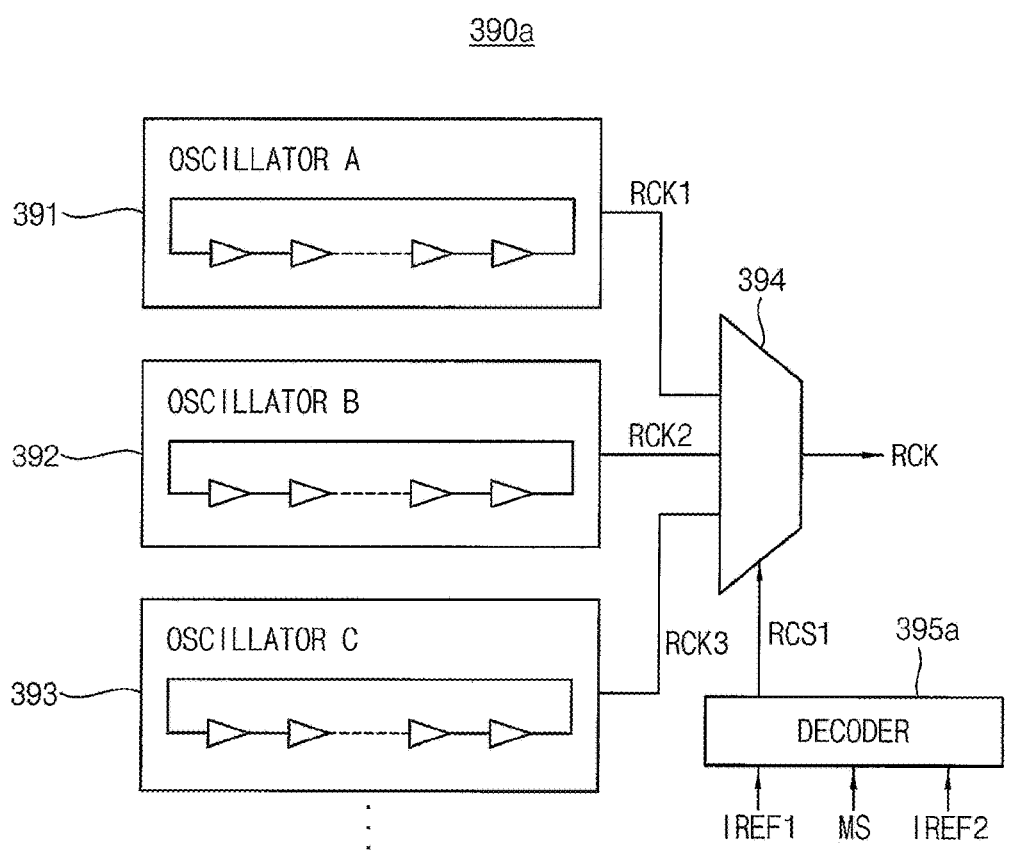
FIG. 5 is a circuit diagram illustrating an example of the refresh clock generator shown in FIG. 4 according to example embodiments.

FIG. 5 is a circuit diagram illustrating an example of the refresh clock generator shown in FIG. 4 according to example embodiments.

Referring to FIG. 5, a refresh clock generator 390a may include a plurality of oscillators 391, 392 and 393, a multiplexer 394 and/or a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 selects one of the refresh clock signals RCK1, RCK2 and RCK3 to provide the refresh clock signal RCK in response to the clock control signal RCS1.

Figure 6:
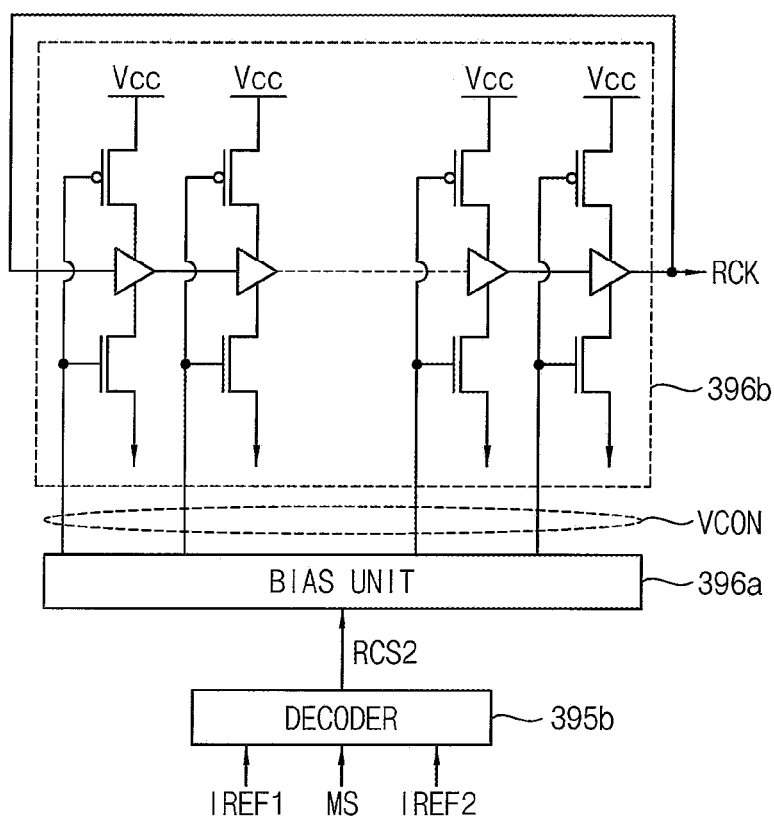
FIG. 6 is a circuit diagram illustrating another example of the refresh clock generator in FIG. 4 according to example embodiments.

FIG. 6 is a circuit diagram illustrating another example of the refresh clock generator in FIG. 4 according to example embodiments.

Referring to FIG. 6, a refresh clock generator 390b may include a decoder 395b, a bias unit 396a and/or an oscillator 396b. The decoder 395b may decode the first refresh control signal IREF1, the second refresh control signal IREF2 and the mode signal MS to output a clock control signal RCS2. The bias unit 396a generates a control voltage VCON in response to the clock control signal RCS2. The oscillator 396b generates the refresh pulse signal RCK having a variable period, according to the control voltage VCON.

Figure 7:
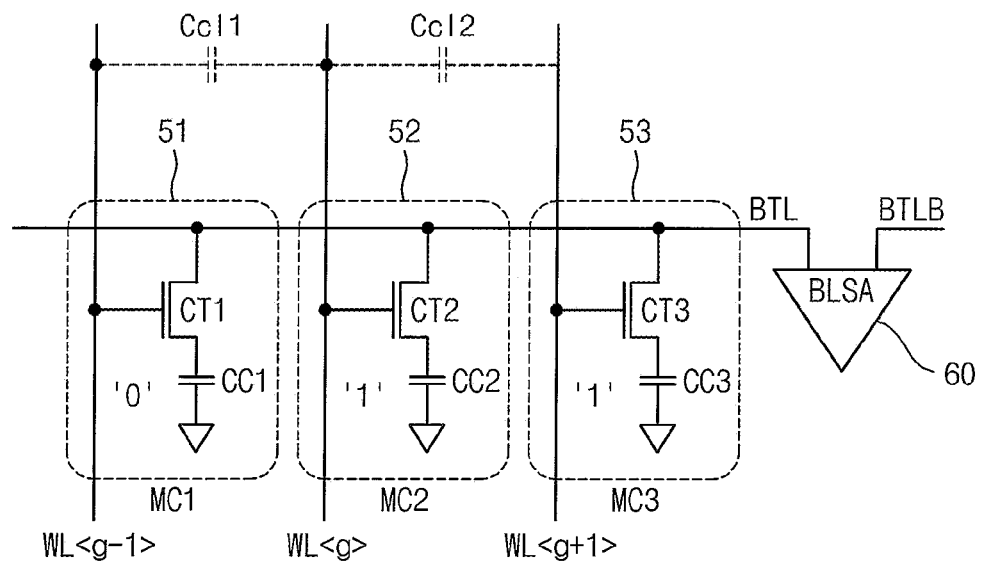
FIG. 7 is a circuit diagram illustrating disturbance between memory cells of a semiconductor memory device.

FIG. 7 is a circuit diagram illustrating disturbance between memory cells of a semiconductor memory device.

Referring to FIG. 7, a part of the semiconductor memory device 200 may include memory cells 51, 52, and 53 and/or a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 7, the word-lines WL<g−1> and WL<g+1> are located adjacent to the word-line WL<g>. The memory cell 51 may include an access transistor CT1 and a cell capacitor CC1. A gate terminal of the access transistor CT1 is connected to the word-line WL<g−1> and its one terminal is connected to the bit-line BTL. The memory cell 52 may include an access transistor CT2 and a cell capacitor CC2. A gate terminal of the access transistor CT2 is connected to the word-line WL<g> and its one terminal is connected to the bit-line BTL. Also, the memory cell 53 may include an access transistor CT3 and a cell capacitor CC3. A gate terminal of the access transistor ST3 is connected to the word-line WL<g+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<g>. Then, due to capacitive coupling effect, a voltage of adjacent word-lines WL<g−1> and WL<g+1> rises even when no select voltage is applied. Such capacitive coupling is indicated with parasitic capacitances Cc11 and Cc21.

During a no refresh operation, when the word-line WL<g> is accessed repeatedly, charges stored in the cell capacitors CC1 and CC3 of the memory cells 51 and 53 connected to the word-lines WL<g−1> and WL<g+1> may leak gradually. In some example embodiments, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 8:
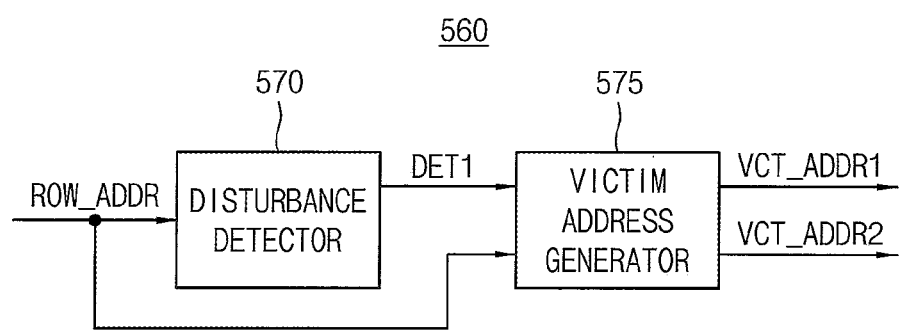
FIG. 8 is a block diagram illustrating an example of the victim address detector in the semiconductor memory device of FIG. 2 according to example embodiments.

FIG. 8 is a block diagram illustrating an example of the victim address detector in the semiconductor memory device of FIG. 2 according to example embodiments.

Referring to FIG. 8, the victim address detector 560 may include a disturbance detector 570 and/or a victim address generator 577.

The disturbance detector 570 may count a number of accesses to a first memory region (e.g., at least one memory cell row) based on the row address ROW_ADDR and may generate a first detection signal DET1 when the number of the counted accesses reaches a reference value during a reference (or predetermined or alternatively, desired) interval.

The victim address generator 577 may generate the at least one victim address VCT_ADDR1 and VCT_ADDR2 in response to the first detection signal DET1. The at least one victim address VCT_ADDR1 and VCT_ADDR2 may be a row address designating a second memory region and a third memory region which are located adjacent to the first memory region. The victim address generator 577 may provide the at least one victim address VCT_ADDR1 and VCT_ADDR2 to an address storing table in the scrubbing control circuit 500.

Figure 9:
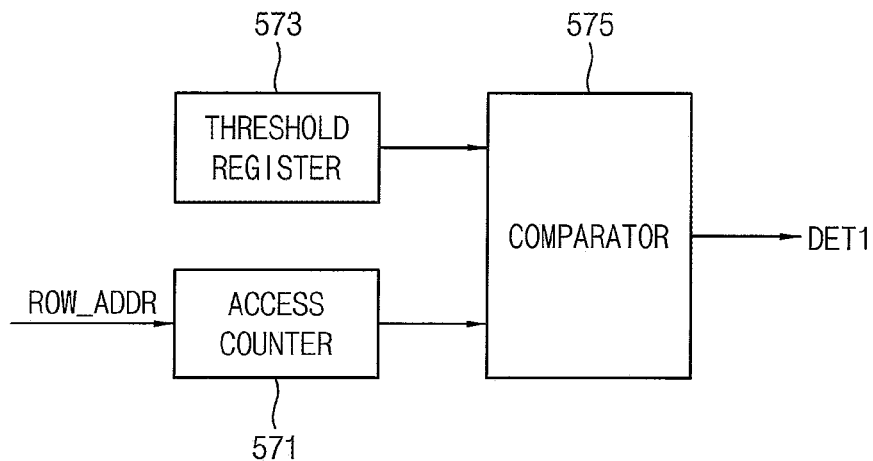
FIG. 9 is a block diagram illustrating the disturbance detector in the victim address detector of FIG. 8.

FIG. 9 is a block diagram illustrating the disturbance detector in the victim address detector of FIG. 8.

Referring to FIG. 9, the disturbance detector 570 may include access counter 571, a threshold register 573 and/or a comparator 575.

The access counter 571 may count a number of accesses to a specified address (or a specified memory region) based on the row address ROW_ADDR. For example, the access counter 571 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 573 may store a maximum disturbance occurrence count that guarantees the reliability of data in a specific word-line or a memory unit. For example, a threshold (or a reference value) on one word-line may be stored in the threshold register 573. Alternatively, a threshold on one word line group, one block, one bank unit, or one chip unit may be stored in the threshold register 573.

The comparator 575 may compare the reference value stored in the threshold register 573 with the number of accesses to a specific memory region counted by the access counter 571. If there is a memory region where the counted number of accesses reaches the reference value, the comparator 575 generates the first detection signal DET1. The comparator 575 provides the first detection signal DET1 to the victim address generator 577.

The victim address generator 577 receives the row address ROW_ADDR and generates the at least one victim address VCT_ADDR1 and VCT_ADDR2 in response to the first detection signal DET1.

Figure 10:
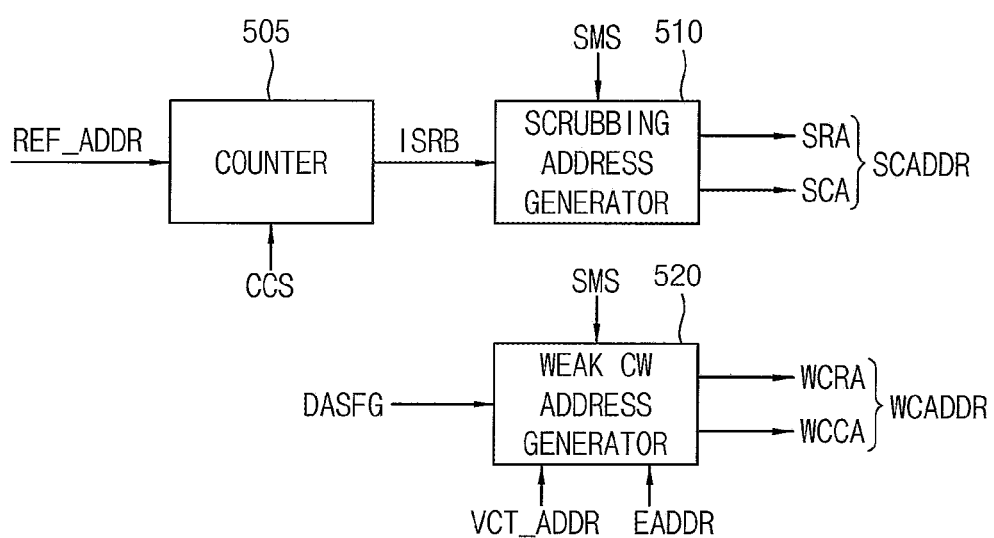
FIG. 10 is a block illustrating an example of the scrubbing control circuit in the semiconductor memory device of FIG. 2 according to example embodiments.

FIG. 10 is a block illustrating an example of the scrubbing control circuit in the semiconductor memory device of FIG. 2 according to example embodiments.

Referring to FIG. 10, the scrubbing control circuit 500 may include a counter 505, a scrubbing address generator 510 and/or a weak codeword address generator 520.

The counter 505 counts the refresh row address REF_ADDR and generates an internal scrubbing signal ISRB which is activated during a first interval when the counter 505 counts the refresh row address REF_ADDR by a number designated by a counting control signal CCS. The first interval may correspond to a time interval for refreshing one memory cell row.

The scrubbing address generator 510 generates a normal scrubbing address SCADDR associated with a normal scrubbing operation for codewords in each of the memory cell rows, which gradually changes in the first scrubbing mode, in response to the internal scrubbing signal ISRB and the scrubbing mode signal SMS.

The normal scrubbing address SCADDR may include a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

The weak codeword address generator 520 generates a weak codeword address WCADDR associated with a weak scrubbing operation associated with weak codewords in the bank array in a second scrubbing mode, in response to the internal scrubbing signal ISRB and the scrubbing mode signal SMS. The weak codeword address WCADDR may include a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level. The scrubbing mode signal SMS may be included in the third control signal CTL3. The weak codeword address generator 520 provides the weak codeword row address WCRA to the corresponding row decoder and provides the weak codeword column address SCA to the corresponding column decoder.

The weak codeword address generator 520 may include an address storing table therein and the address storing table may store addresses of codewords associated with the victim address VCT_ADDR and the error address EADDR.

The scrubbing operation performed based on the weak codeword address WCADDR may be referred to as a weak scrubbing operation because the scrubbing operation performed based on the weak codeword address WCADDR is performed on weak codewords included in the memory cell array 300.

Figure 11:
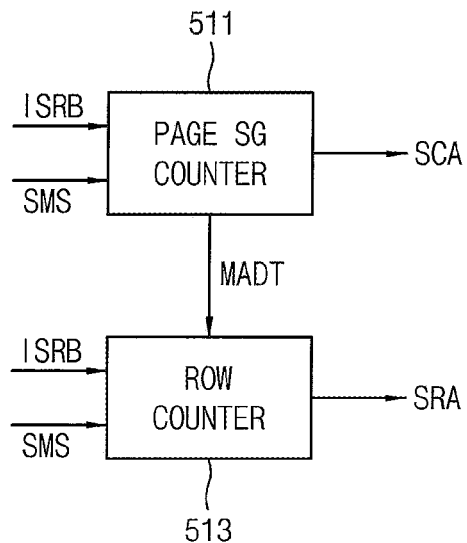
FIG. 11 is a block diagram illustrating the scrubbing address generator in the scrubbing control circuit of FIG. 10 according to example embodiments.

FIG. 11 is a block diagram illustrating the scrubbing address generator in the scrubbing control circuit of FIG. 10 according to example embodiments.

Referring to FIG. 11, the scrubbing address generator 510 may include a page segment counter 511 and a row counter 513.

The page segment counter 511 increases the scrubbing column address SCA by one during the internal scrubbing signal ISRB is activated in the first scrubbing mode and actives a maximum address detection signal MADT with being reset whenever the scrubbing column address SCA reaches its maximum value, in response to the internal scrubbing signal ISRB and the scrubbing mode signal SMS. The page segment counter 511 provides the maximum address detection signal MADT to the row counter 513.

The row counter 513 starts counting operation one receiving the internal scrubbing signal ISRB initially and increases the scrubbing row address SRA by one whenever the activated maximum address detection signal MADT in response to the internal scrubbing signal ISRB and the scrubbing mode signal SMS. Since the internal scrubbing signal ISRB is activated during the first interval while a refresh operation is performed on one memory cell row, the page segment counter 511 may generate the scrubbing column address SCA associated with codewords in one page during the first interval.

Figure 12:
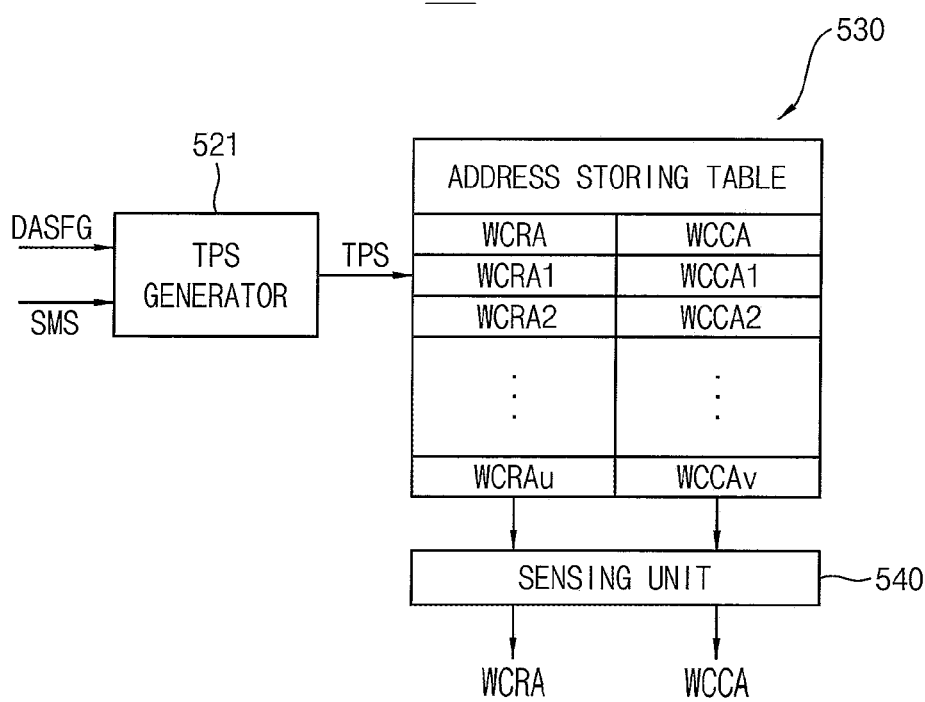
FIG. 12 illustrates the weak codeword address generator in the scrubbing control circuit of FIG. 10 according to example embodiments.

FIG. 12 illustrates the weak codeword address generator in the scrubbing control circuit of FIG. 10 according to example embodiments.

Referring to FIG. 12, the weak codeword address generator 520 may include a pointer signal (TPS) generator 521, an address storing table 530 and/or a sensing unit 540.

The address storing table 530 stores address information WCRA1~WCRAu and WCCA1~WCCAv (v is a positive integer greater than u) of weak codewords included in the memory cell array 300.

The weak codewords may be codewords in each of which an error bit is detected during the normal scrubbing operation or the normal read operation. The weak codewords may be all or some of a weak page including a number of error bit greater than a reference value among pages in each bank array of the memory cell array 300. In addition, the weak codewords may be codewords of neighbor pages adjacent to the intensively accessed memory region.

The table pointer 521 may generate a pointer signal TPS which provide location information for the address storing table 530 in response to the flag signal DASFG and the scrubbing mode signal SMS during a refresh cycle, and provides the pointer signal TPS to the address storing table 530 with a second period. The flag signal DASFG may trigger the DAS operation.

The address storing table 530 may include a nonvolatile storage. The at least one victim address VCT_ADDR1 and VCT_ADDR2 provided from the victim address generator 577 in FIG. 8 may be stored in the address storing table 530.

The pointer signal TPS gradually increases with the second period during the refresh cycle and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder and provides the weak codeword column address WCCA to a corresponding column decoder.

As mentioned above, the control logic circuit 210 may provide the error address EADDR to the scrubbing control circuit 500. When the scrubbing control circuit 500 performs K scrubbing operations on a specific memory cell row and the ECC engine 400 detects an error bit in reading the specific memory cell row, it is determined that the specific memory cell row has a permanent fault. The error bits may be accumulated when the specific memory cell row having the permanent fault is not replaced. Therefore, the control logic circuit 210 or the memory controller 10 may replace the specific memory cell row having the permanent fault with a redundancy memory cell row through a redundancy repair operation.

In addition, the control logic circuit 210 may apply different refresh periods to some memory cell rows based on a number of error bits for each of the memory cell rows, which are detected by the scrubbing operation.

Figure 13:
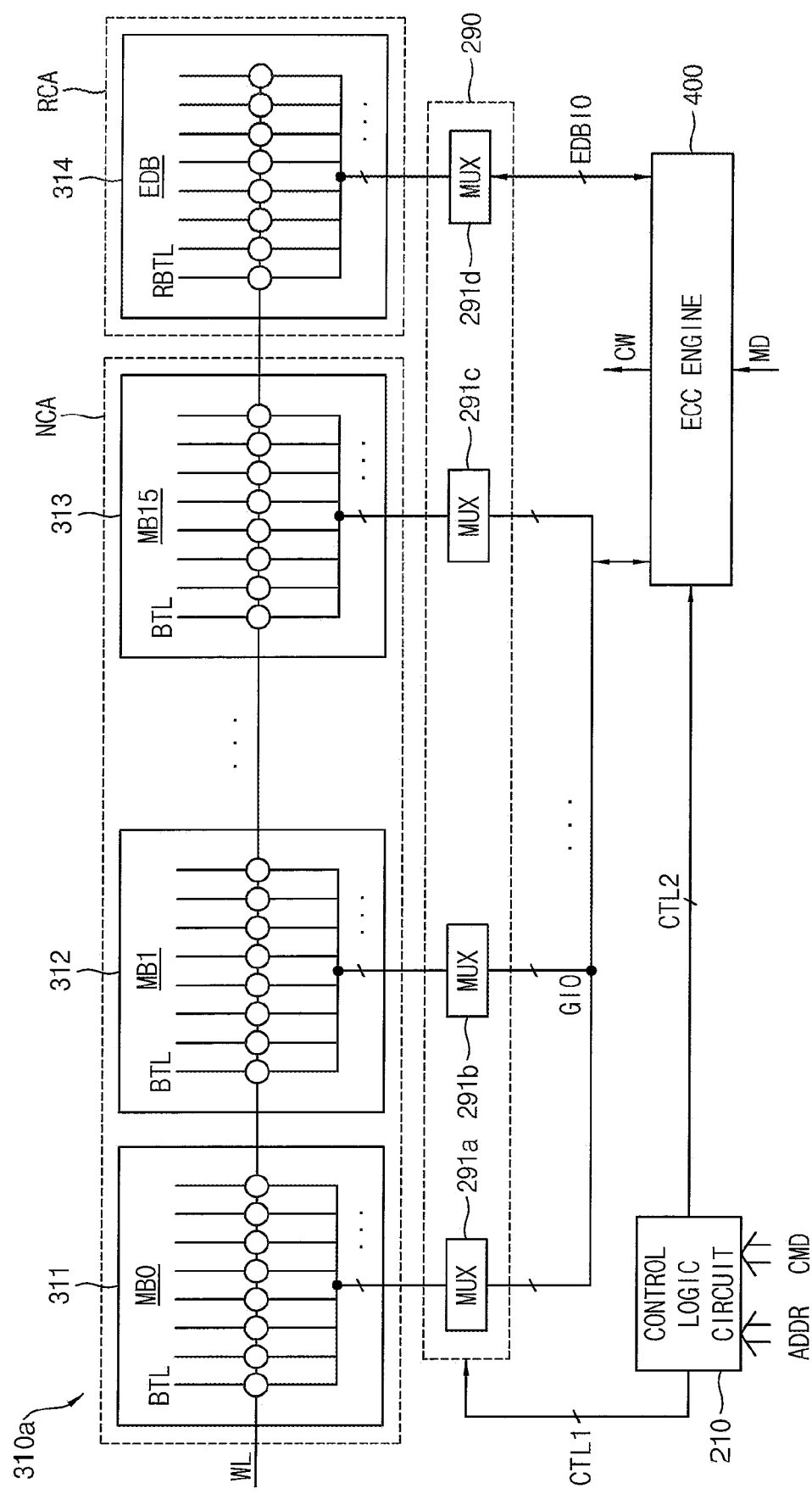
FIG. 13 illustrates a portion of the semiconductor memory device of FIG. 2 in a write operation.

FIG. 13 illustrates a portion of the semiconductor memory device of FIG. 2 in a write operation.

In FIG. 13, the control logic circuit 210, the first bank array 310, the I/O gating circuit 290, and the ECC engine 400 are illustrated.

Referring to FIG. 13, the first bank array 310 may include a normal cell array NCA and/or a redundancy cell array RCA.

The normal cell array NCA may include a plurality of first memory blocks MB0~MB15, e.g., 311~313, and the redundancy cell array RCA may include at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 may include a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible.

The ECC engine 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC circuit 400.

When the command CMD is a write command, the control logic circuit 210 provides the second control signal CTL2 to the ECC circuit 400 and the ECC circuit 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 14:
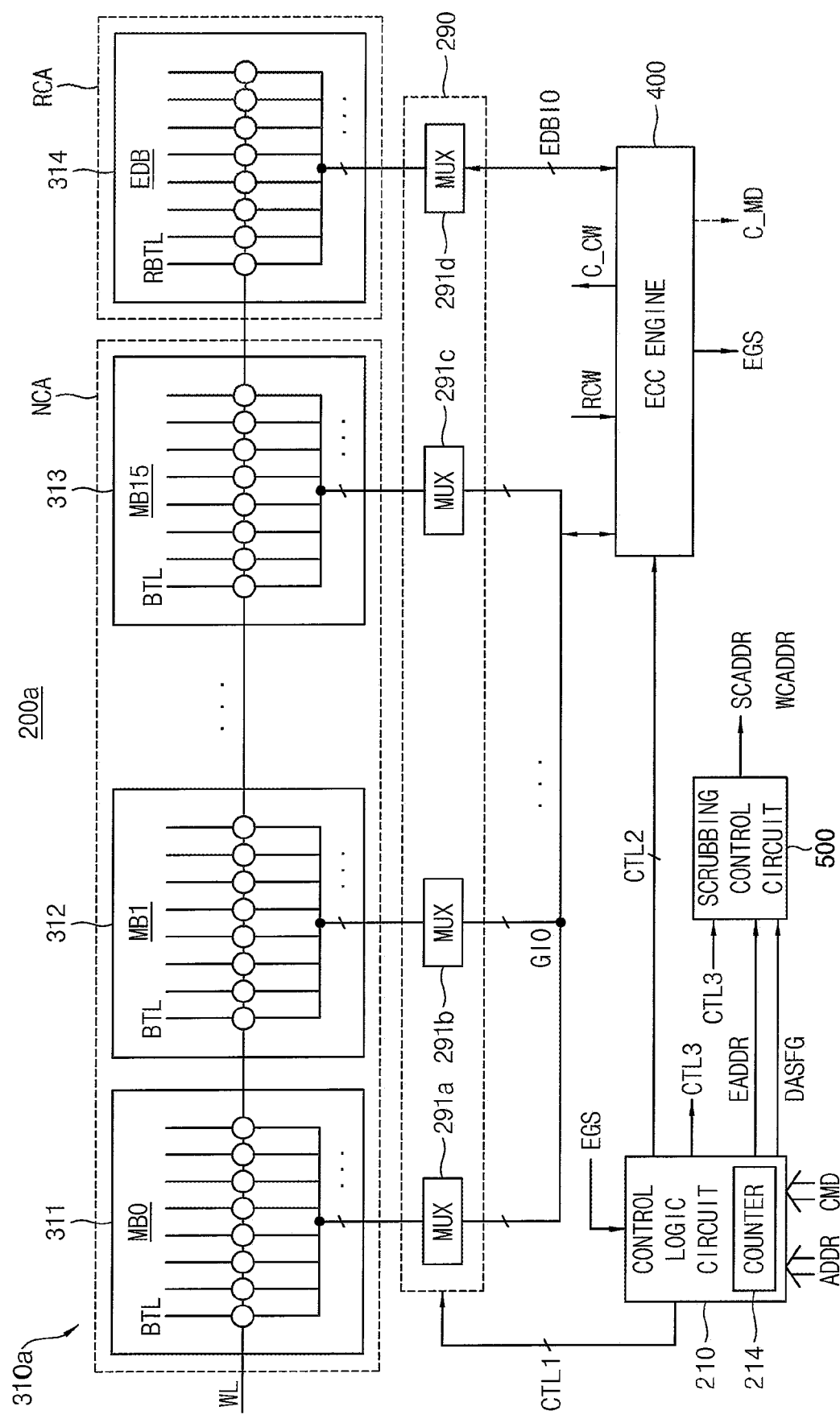
FIG. 14 illustrates a portion of the semiconductor memory device of FIG. 2 in a refresh operation or a normal read operation.

FIG. 14 illustrates a portion of the semiconductor memory device of FIG. 2 in a refresh operation or a normal read operation.

In FIG. 14, the control logic circuit 210, the first bank array 310, the I/O gating circuit 290, the ECC engine 400 and the scrubbing control circuit 500 are illustrated.

Referring to FIG. 14, when the command CMD is a refresh command (a first command) to designate a refresh operation, the control logic circuit 210 provides the first control signal CTL1 to the I/O gating circuit 290 such that a first (read) codeword RCW stored in each of sub-pages of the target page in the first bank array 310 is provided to the ECC circuit 400.

In the refresh operation, the ECC engine 400 performs the ECC decoding on the codeword RCW. When the codeword RCW includes an error bit, the ECC engine 400 performs a normal scrubbing operation to correct the error bit and to write back the corrected main data in the sub-age When an error bit is detected during the normal scrubbing operation, the ECC engine 400 provides the error generation signal EGS to the control logic circuit 210 in response to detecting the error bit. The control logic circuit 210 may count the error generation signal EGS for one page and store an address of the codeword including the error bit in the address storing table as the error address EADDR and may apply the flag signal DASFG to the scrubbing control circuit 500.

The scrubbing control circuit 500 may provide the weak codeword row address WCRA and the weak codeword column address WCCA stored in the address storing table 530 to the row decoder 260 and the column decoder 270, respectively, in response to the flag signal DASFG.

When the command CMD corresponds to a read command, the ECC engine 400 may provide a corrected main data C_MD to the data I/O buffer 295.

Therefore, the ECC circuit 400, in a scrubbing operation performed in response to a refresh command or a read command, performs an error detection (operation) on codewords in a selected memory cell row and writes back codewords, each including a correctable error bit, in corresponding memory locations, in response to error information. Accordingly, the ECC circuit 400 may reduce time interval for performing the scrubbing operation and may reduce scrubbing period.

Figure 15:
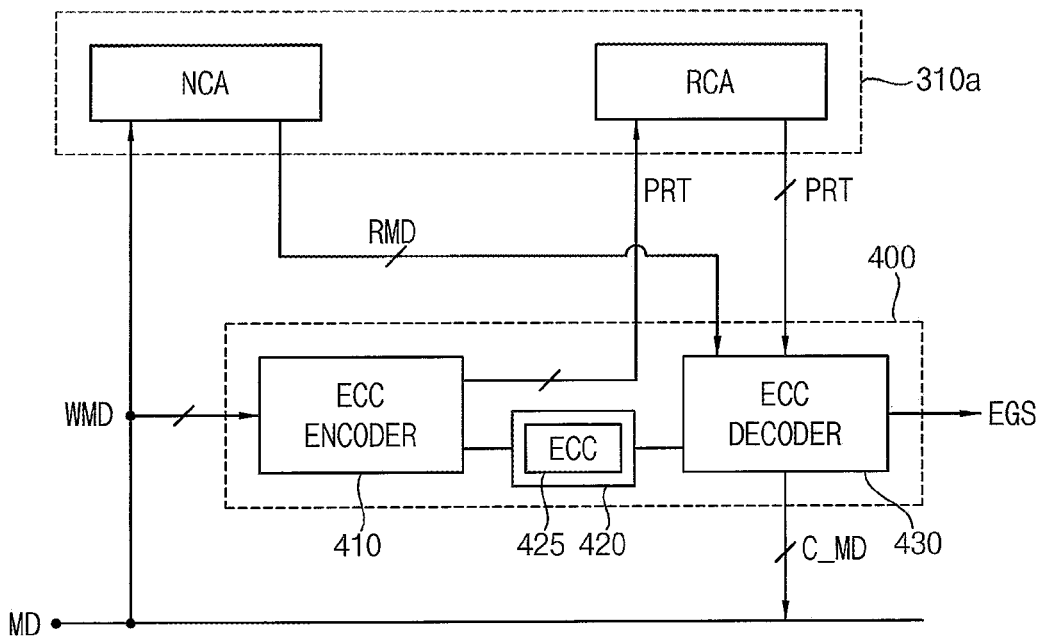
FIG. 15 is a block diagram illustrating an example of the ECC engine in the semiconductor memory device of FIG. 2 according to example embodiments.

FIG. 15 is a block diagram illustrating an example of the ECC engine in the semiconductor memory device of FIG. 2 according to example embodiments.

Referring to FIG. 15, the ECC engine 400 may include an ECC encoder 410, an ECC decoder 430 and/or an ECC memory 420. The ECC memory 420 may store an ECC 425.

The ECC encoder 410 is coupled to the ECC memory 420, and may generate parity bits PRT associated with a write data WMD to be stored in the normal cell array NCA of the first bank array 310. The parity bits PRT may be stored in the redundancy cell array RCA of the first bank array 310.

The ECC decoder 430 is coupled to the ECC memory 420. The ECC decoder 430 may perform an ECC decoding on a read data RMD based on the read data RMD and the parity bits PRT read from the first bank array 310. When the read data RMD includes at least one error bit as a result of the ECC decoding, the ECC decoder 430 provides the error generation signal EGS to the control logic circuit 210, and corrects the error bit in the read data RMD to output the corrected main data C_MD.

Figure 16:
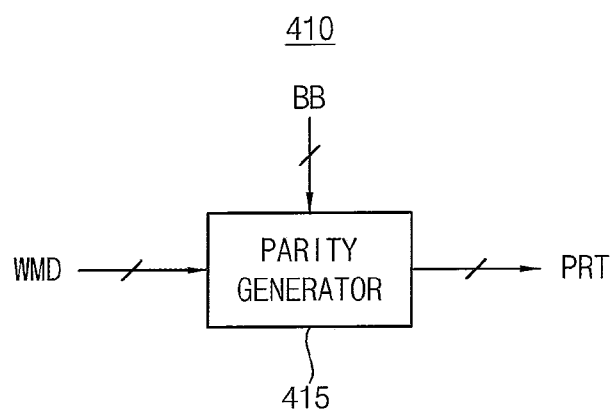
FIG. 16 illustrates an example of the ECC encoder in the ECC engine of FIG. 15 according to example embodiments.

FIG. 16 illustrates an example of the ECC encoder in the ECC engine of FIG. 15 according to example embodiments.

Referring to FIG. 16, the ECC encoder 410 may include a parity generator 415. The parity generator 415 receives the write data WMD and basis bit BB and generates the parity bits PRT by performing, for example, an XOR array operation. The basis bit BB is bits for generating the parity bits PRT with respect to the write data WMD and may include b'0000000. The basis bit BB may include other particular bits instead of b'0000000.

Figure 17:
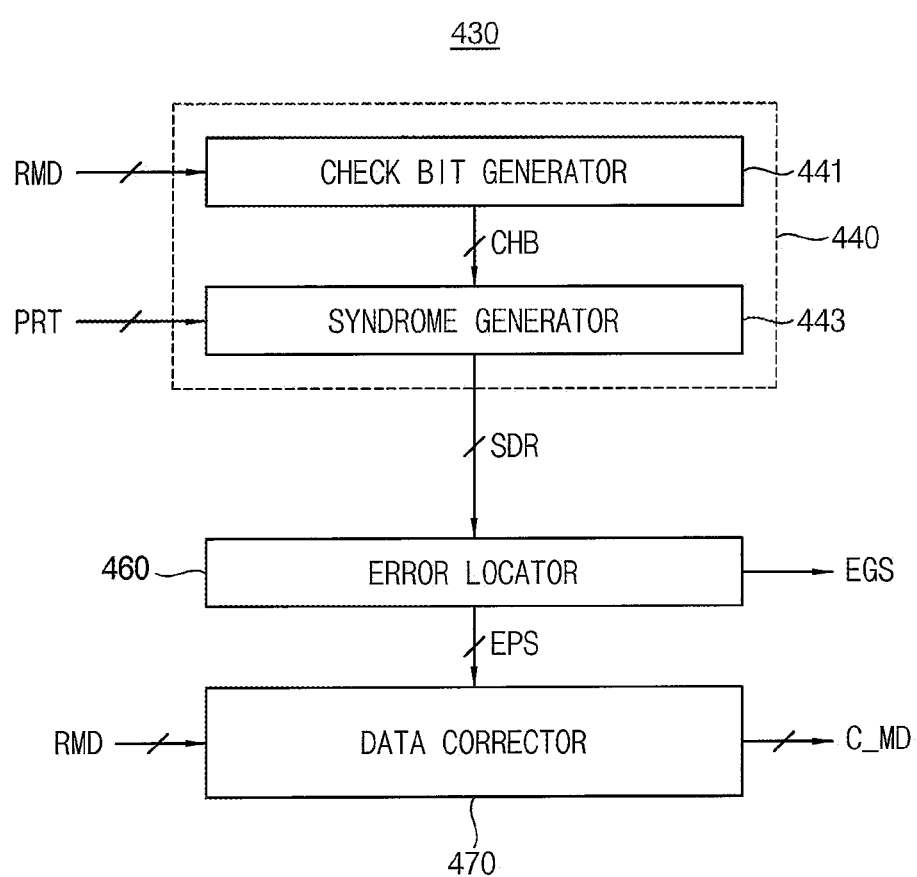
FIG. 17 illustrates an example of the ECC decoder in the ECC engine of FIG. 15 according to example embodiments.

FIG. 17 illustrates an example of the ECC decoder in the ECC engine of FIG. 15 according to example embodiments.

Referring to FIG. 17, the ECC decoder 430 may include a syndrome generation circuit 440, an error locator 460 and/or a data corrector 470. The syndrome generation circuit 440 may include a check bit generator 441 and/or a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indication a position of an error bit in the read data RMD to provide the error position signal EPS to the data corrector 470 when all bits of the syndrome SDR are not 'zero'. In addition, when the read data RMD includes the error bit, the error locator 460 providers the error generation signal EGS to the control logic circuit 210.

The data corrector 470 receives the read data RMD, corrects the error bit in the read data RMD based on the error position signal EPS when the read data RMD includes error bit and outputs the corrected main data C_MD.

Figure 18:
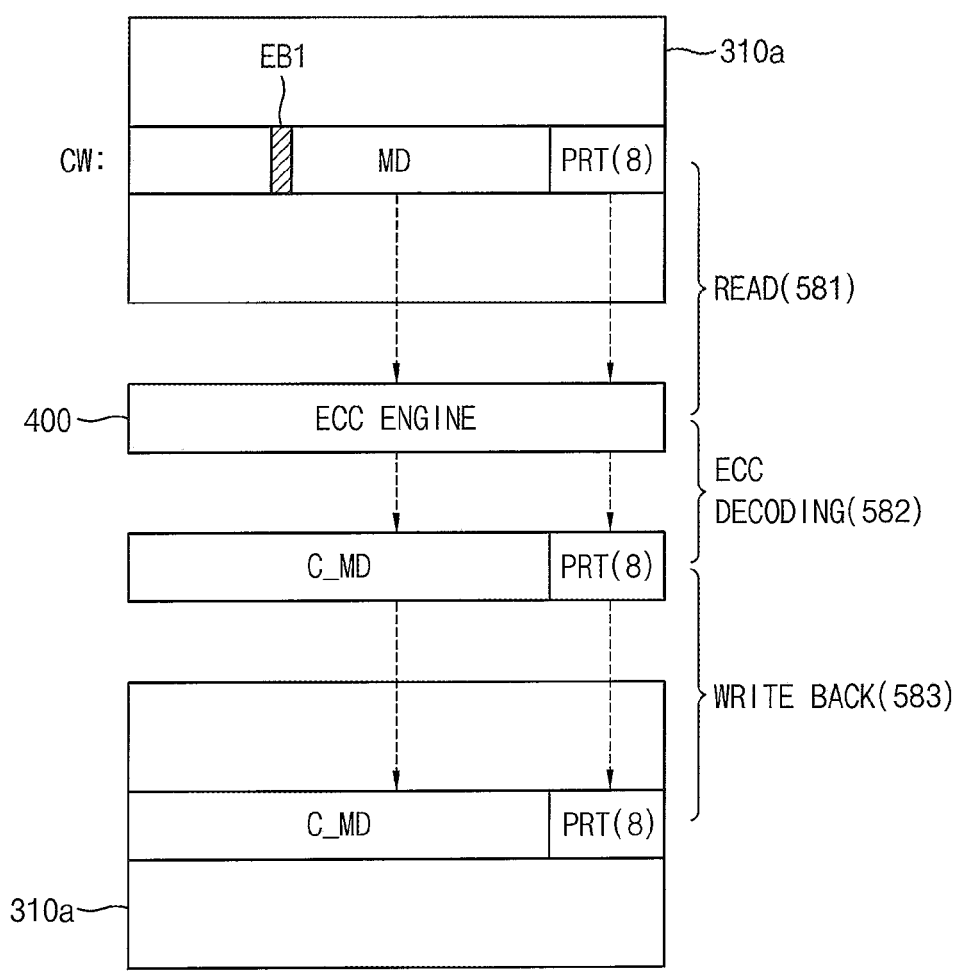
FIG. 18 illustrates an operation of the ECC decoder of FIG. 17 according to example embodiments.

FIG. 18 illustrates an operation of the ECC decoder of FIG. 17 according to example embodiments.

Referring to FIGS. 17 and 18, in a scrubbing operation in response to a refresh command, the codeword CW may include at least one error bit EB1. The codeword CW is read from a first page and is provides to the ECC engine 400 as a reference numeral 581 indicates. The ECC engine 400 performs the ECC decoding on the codeword CW to correct the at least one error bit EB1 as a reference numeral 582 indicates and writes back the corrected main data C_MD in a sub-page of the first page as a reference numeral 583 indicates.

Figure 19:
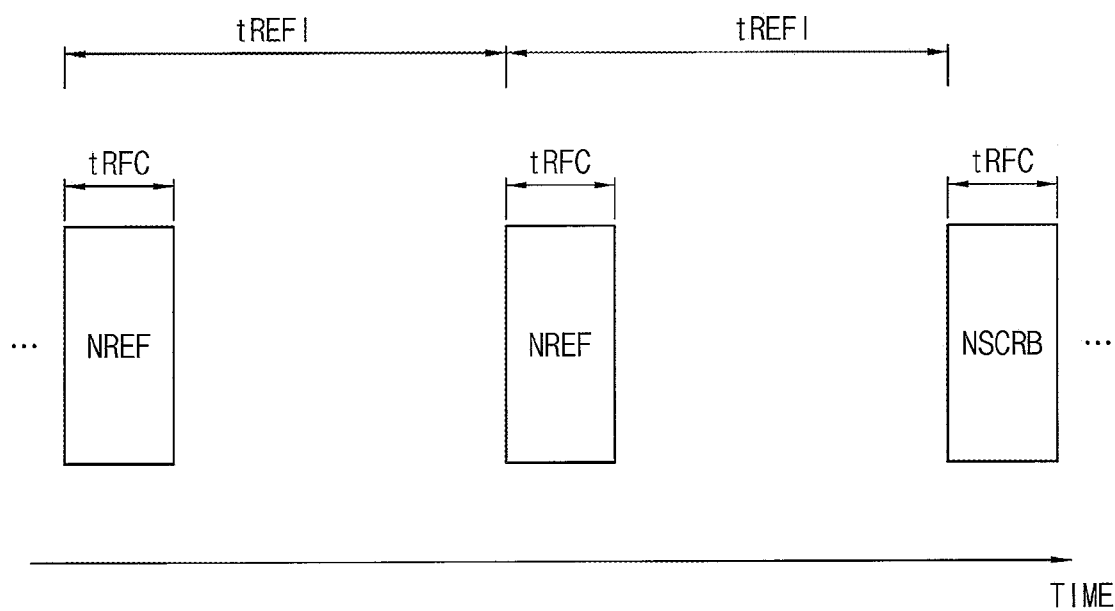
FIG. 19 illustrates a normal refresh operation and a scrubbing operation performed in the semiconductor memory device of FIG. 2.

FIG. 19 illustrates a normal refresh operation and a scrubbing operation performed in the semiconductor memory device of FIG. 2.

In FIG. 19, tRFC denotes a refresh cycle and means a time for refreshing one row, and tREFI denotes a refresh interval and means an interval between two consecutive refresh commands.

Referring to FIG. 19, it is noted that the scrubbing control circuit 500 designates memory cell rows M times, on which the ECC engine performs the scrubbing operation SCRB whenever the normal refresh operation REF is performed on memory cell rows N-times in response to the refresh command. Here, M is an integer greater than one and smaller than N.

Figure 20:
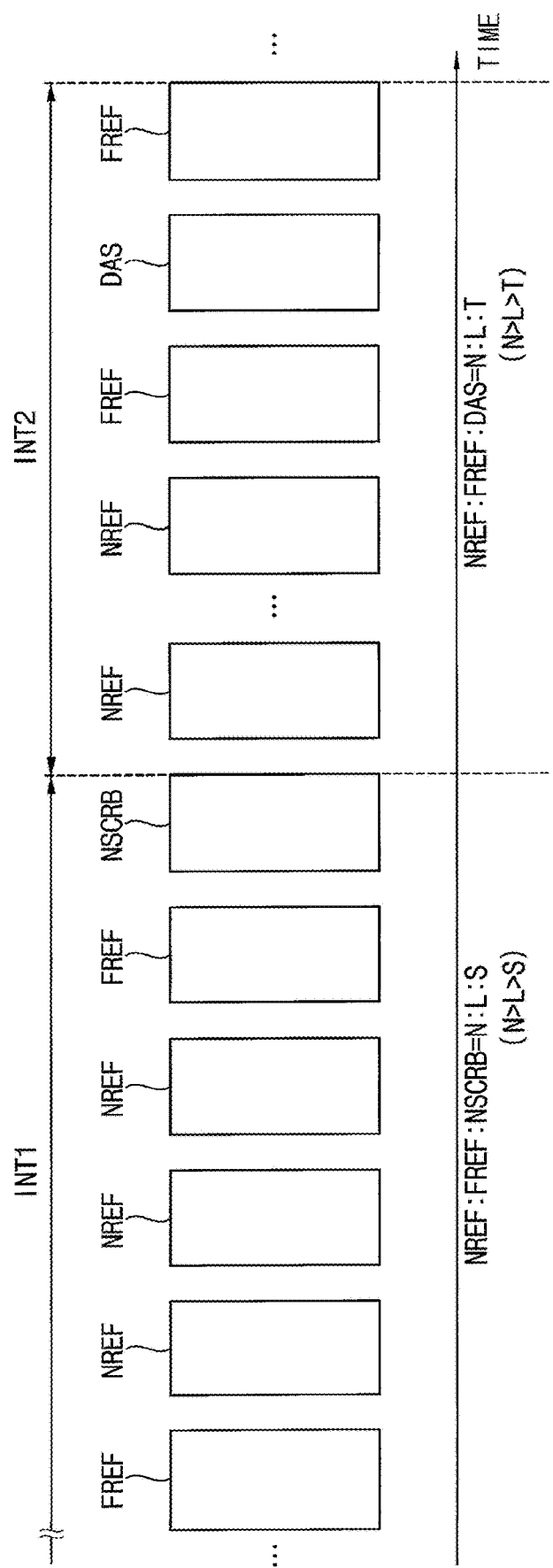
FIG. 20 illustrates that a normal refresh operation and a scrubbing operation are performed in the semiconductor memory device of FIG. 2.

FIG. 20 illustrates that a normal refresh operation and a scrubbing operation are performed in the semiconductor memory device of FIG. 2.

Referring to FIG. 20, it is noted that the scrubbing control circuit 500 designates memory cell rows S times, on which the ECC engine 400 performs the scrubbing operation SCRB and a refresh operation FREF on an adjacent memory region corresponding to the victim address VCT_ADDR is performed L times whenever the normal refresh operation NREF is performed on memory cell rows N-times in response to the refresh command during a first interval INT1. Here L is a natural number smaller than N and S is a natural number smaller than L.

During a second interval INT2, a refresh operation FREF on an adjacent memory region corresponding to the victim address VCT_ADDR is performed L times and a DAS operation DAS on the weak codewords is performed T times whenever the normal refresh operation NREF is performed on memory cell rows N-times in response to the refresh command during a first interval INT1. Here T is a natural number smaller than N and L.

Figure 21:
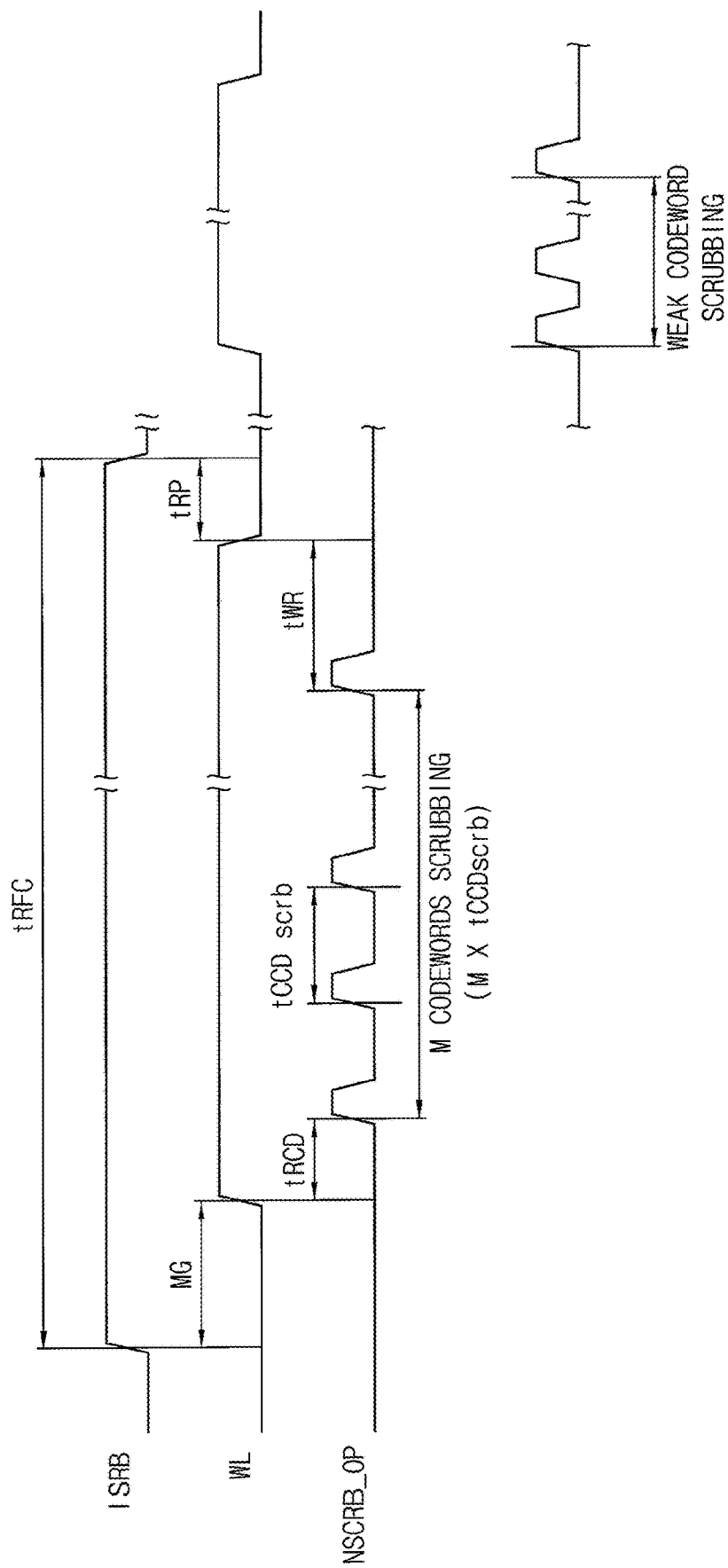
FIG. 21 illustrates a timing of the scrubbing operation in FIG. 19 or in FIG. 20.

FIG. 21 illustrates a timing of the scrubbing operation in FIG. 19 or in FIG. 20.

Referring to FIG. 21 during the refresh cycle tRFC while a refresh operation is being performed on one memory cell row, the internal scrubbing signal ISRB is activated with a logic high level. A word-line WL coupled to a memory cell row designated by the scrubbing row address is activated after the refresh command is applied and a margin MG elapses.

Normal scrubbing operation NSCRB_OP is sequentially performed on M codewords in the memory cell row designated by the scrubbing row address after the word-line WL is activated and RAS to CAS delay time tRCD elapses. The scrubbing operation on one codeword is performed during a time interval tCCDscrb. During write time tWR, corrected codewords are written back in corresponding memory locations and the word-line WL is deactivated after the corrected codewords are written back.

The internal scrubbing signal ISRB is deactivated after the word-line WL is deactivated and a row precharge time tRP elapses.

When at least one weak codeword is detected during the normal scrubbing operation NSCRB_OP, the word-line WL is activated during one interval in the refresh operation, and the DAS operation may be performed on the at least one weak codeword.

Figure 22A:
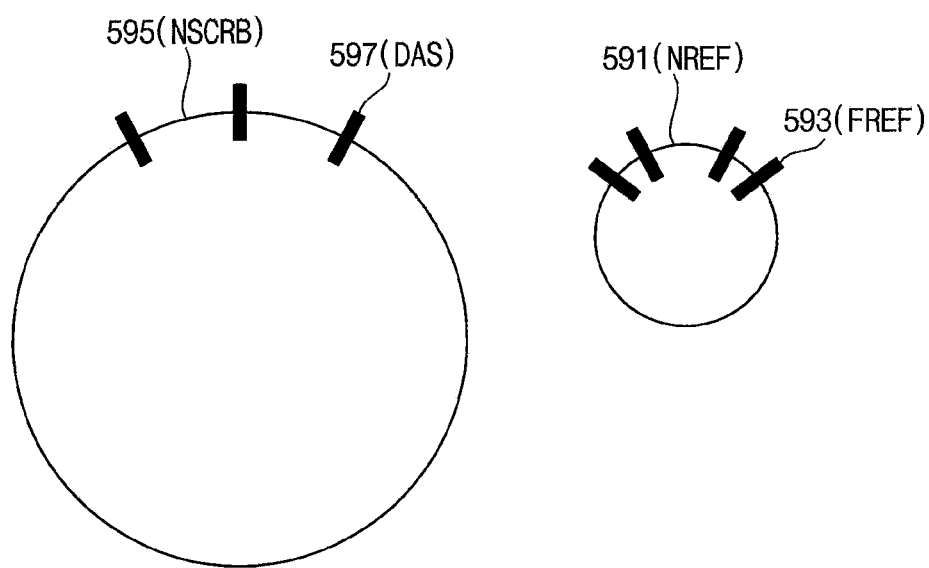
FIG. 22A illustrates a refresh operation and a scrubbing operation which the semiconductor memory device performs according to example embodiments.

FIG. 22A illustrates a refresh operation and a scrubbing operation which the semiconductor memory device performs according to example embodiments.

In FIG. 22A, a reference numeral 591 denotes a normal refresh operation NREF, and a reference numeral 593 denotes a target refresh operation FREF on the victim memory regions. A reference numeral 595 denotes a normal scrubbing operation NSCRB, and a reference numeral 597 denotes a DAS operation DAS.

Referring to FIG. 22A, it is noted that the DAS operation DAS is more frequently performed on the weak codewords than the normal scrubbing operation NSCRB and the target refresh operation FREF is more frequently performed than the normal refresh operation NREF.

That is, when the control logic circuit 210 in FIG. 14 receives the error generation signal EGS in response to detecting the error bit during the normal scrubbing operation or the normal read operation, the control logic circuit 210 secures additional refresh time interval within a predetermined or alternatively, desired refresh period, and may perform the DAS operation DAS or the target refresh operation FREF during the additional refresh time interval.

Figure 22B:
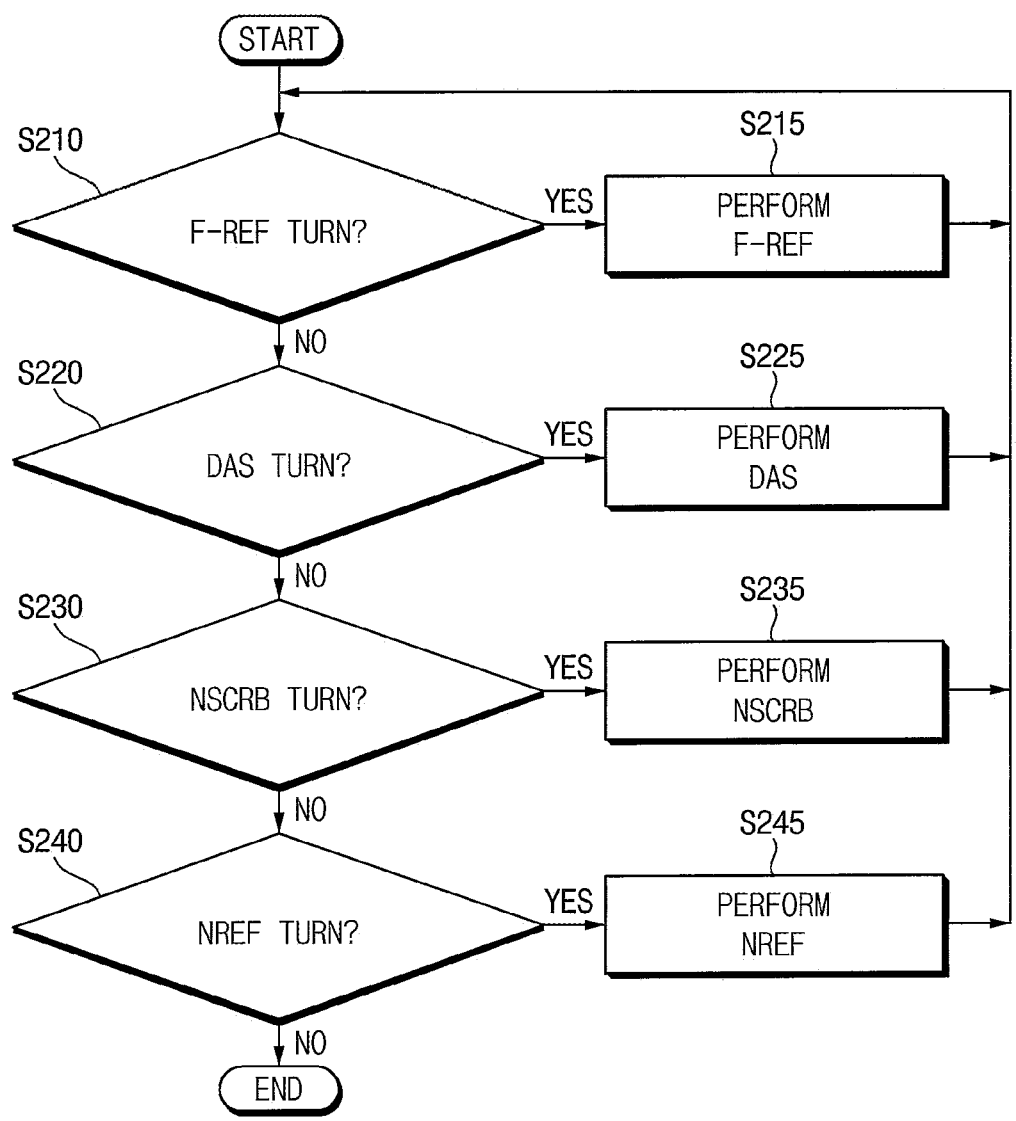
FIG. 22B illustrates an operation on one memory cell row in the semiconductor memory device according to example embodiments.

FIG. 22B illustrates an operation on one memory cell row in the semiconductor memory device according to example embodiments.

Referring to FIG. 22B, it is determined whether a corresponding memory cell row is in a turn for a target refresh operation FREF (operation S210). When the corresponding memory cell row is in a turn for the target refresh operation FREF (YES in S210), the target refresh operation FREF is performed on the corresponding memory cell row (operation S215).

When the corresponding memory cell row is not in a turn for the target refresh operation FREF (NO in S210), it is determined whether the corresponding memory cell row is in a turn for a DAS operation DAS (operation S220). When the corresponding memory cell row is in a turn for the DAS operation DAS (YES in S220), the DAS operation DAS is performed on the corresponding memory cell row (operation S225).

When the corresponding memory cell row is not in a turn for DAS operation DAS (NO in S220), it is determined whether the corresponding memory cell row is in a turn for a normal scrubbing operation NSCRB (operation S230). When the corresponding memory cell row is in a turn for the normal scrubbing operation NSCRB (YES in S230), the normal scrubbing operation NSCRB is performed on the corresponding memory cell row (operation S235).

When the corresponding memory cell row is not in a turn for the normal scrubbing operation NSCRB (NO in S230), it is determined whether the corresponding memory cell row is in a turn for a normal refresh operation NREF (operation S240). When the corresponding memory cell row is in a turn for the normal refresh operation NREF (YES in S240), the normal refresh operation NREF is performed on the corresponding memory cell row (operation S245). When the corresponding memory cell row is not in a turn for the normal refresh operation NREF (NO in S240), the process is terminated.

Figure 23:
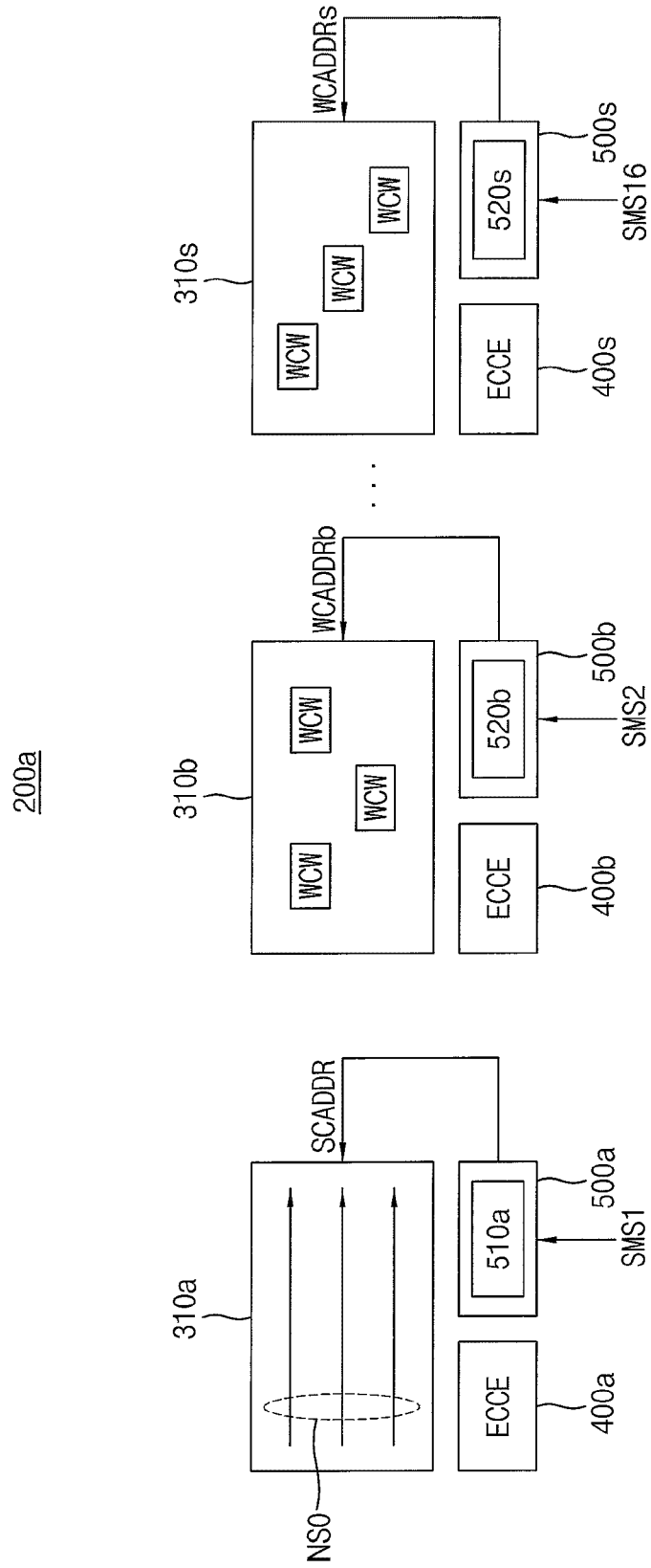
FIG. 23 is a block diagram illustrating a semiconductor memory device according to example embodiments.

FIG. 23 is a block diagram illustrating a semiconductor memory device according to example embodiments.

Referring to FIG. 23, a semiconductor memory device 200a is illustrated. The semiconductor memory device 200a may include a plurality of bank arrays 310a~310s, a plurality of bank ECC engines 400a~400s corresponding to the plurality of bank arrays 310a~310s and a plurality of bank scrubbing control circuit 500a~500s corresponding to the plurality of bank arrays 310a~310s. The plurality of bank ECC engines 400a~400s may correspond to the ECC engine 400 in FIG. 2 and the plurality of bank scrubbing control circuit 500a~500s may correspond to the scrubbing control circuit 500 in FIG. 2.

A scrubbing address generator 510a in the bank scrubbing control circuit 500a corresponding to the bank array 310a is enabled in response to the scrubbing mode signal SMS1 and generates the scrubbing address SCADDR and the bank ECC engine 400a performs a normal scrubbing operation NS0 on all codewords in the bank array 310a.

A weak codeword address generator 520b in the bank scrubbing control circuit 500b corresponding to the bank array 310b is enabled in response to the scrubbing mode signal SMS2 and generates weak codeword address WCADDRa and the bank ECC engine 400b performs a DAS operation on weak codewords WCW in the bank array 310b.

A weak codeword address generator 520s in the bank scrubbing control circuit 500s corresponding to the bank array 310s is enabled in response to the scrubbing mode signal SMS16 and generates weak codeword address WCADDRs and the bank ECC engine 400s performs a DAS operation on weak codewords WCW in the bank array 310s.

Figure 24:
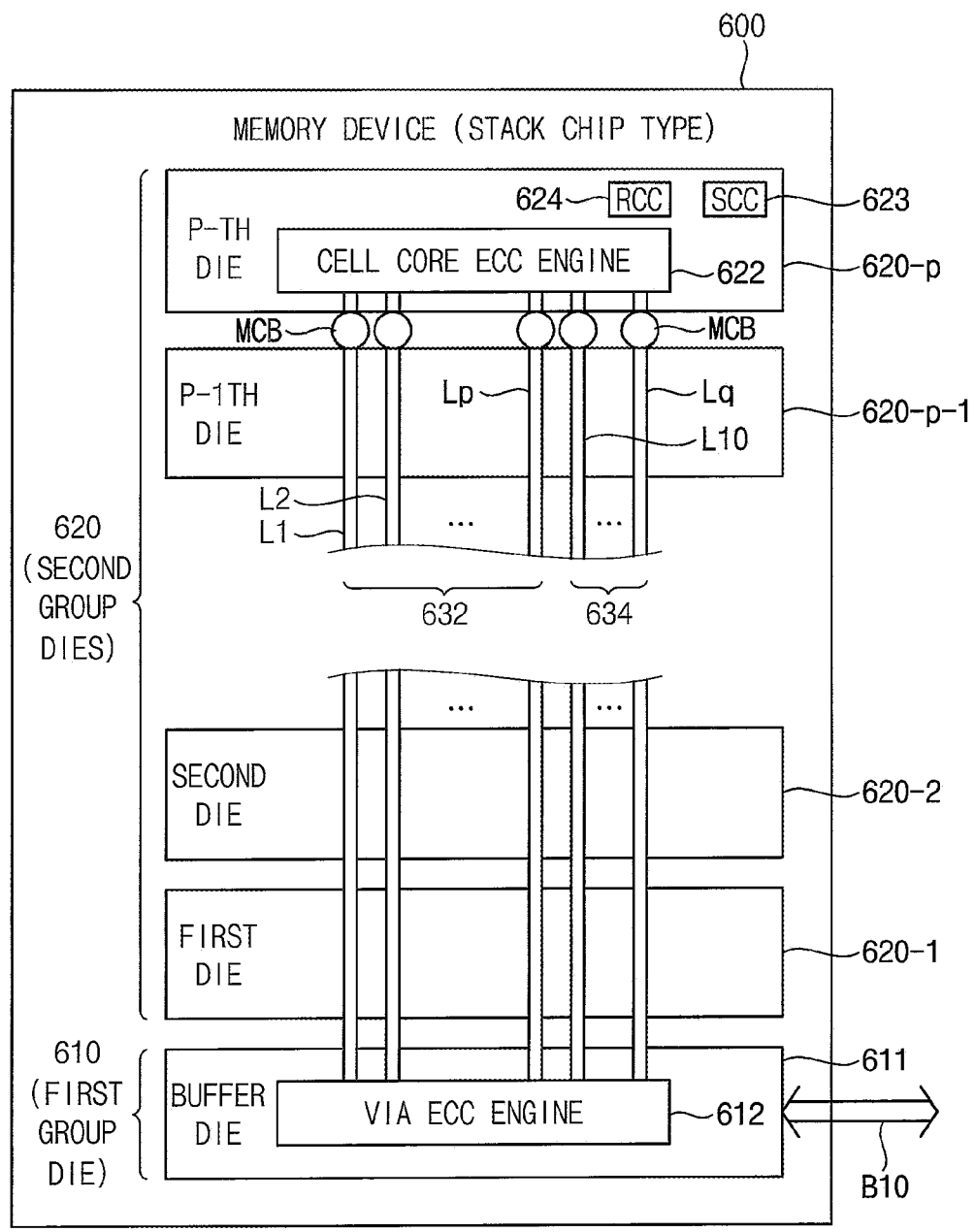
FIG. 24 is a block diagram illustrating a semiconductor memory device according to example embodiments.

Each of the plurality of bank ECC engines 400a~400s and each of the plurality of bank scrubbing control circuit 500a~500s perform the normal scrubbing operation and the DAS operation on respective one of the plurality of bank arrays 310a~310s independently from one another. Each of the plurality of bank ECC engines 400a~400s and each of the plurality of bank scrubbing control circuit 500a~500s may selectively perform DAS operation based on whether the weak codeword is detected in the normal scrubbing operation FIG. 24 is a block diagram illustrating a semiconductor memory device according to example embodiments.

Referring to FIG. 22, a semiconductor memory device 600 may include first group die 610 and/or second group dies 620 providing a soft error analyzing and correcting function in a stacked chip structure.

The first group die 610 may include at least one buffer die 611. The second group dies 620 may include a plurality of memory dies 620-1 to 620-p which is stacked on the at least one buffer die 611 and conveys data through a plurality of through silicon via (TSV) lines.

Each of the memory dies 620-1 to 620-p may include a cell core ECC engine (e.g., a first type ECC engine) 622 which generates transmission parity bits (e.g., transmission parity data) based on transmission data to be sent to the first group die 610, a refresh control circuit 624 and a scrubbing control circuit 623. The cell core ECC engine 622 may employ the ECC engine 400 of FIG. 15. The refresh control circuit 624 may employ the refresh control circuit 385 of FIG. 4. The scrubbing control circuit 623 may employ the scrubbing control circuit 500 of FIG. 10.

The cell core ECC engine 622 and the scrubbing control circuit 623 may perform a normal scrubbing operation on codewords with a first period to detect an error bit during a refresh operation on memory cell rows in a memory die, may store addresses of weak codewords in each of which an error bit is detected, and may perform a DAS operation with a second period to reduce or prevent error bit from being accumulated.

The buffer die 611 may include a vis ECC engine 612 which corrects a transmission error using the transmission parity bits when a transmission error is detected from the transmission data received through the TSV liens and generates error-corrected data.

The semiconductor memory device 600 may be a stack chip type memory device or a stacked memory device which conveys data and control signals through the TSV lines. The TSV lines may be also called 'through electrodes'.

The cell core ECC engine 622 may perform error correction on data which is outputted from the memory die 620-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A data TSV line group 632 which is formed at one memory die 620-p may include TSV lines L1 to Lp, and a parity TSV line group 634 may include TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

Each of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 611 may be connected with the memory controller through the data bus B10.

The cell core ECC engine 622 may output transmission parity bits as well as the transmission data through the parity TSV line group 634 and the data TSV line group 632 respectively. The outputted transmission data may be data which is error-corrected by the cell core ECC engine 622.

The via ECC engine 612 may determine whether a transmission error occurs at the transmission data received through the data TSV line group 632, based on the transmission parity bits received through the parity TSV line group 634. When a transmission error is detected, the via ECC engine 612 may correct the transmission error on the transmission data using the transmission parity bits. When the transmission error is uncorrectable, the via ECC engine 612 may output information indicating occurrence of an uncorrectable data error.

When an error is detected from read data in a high bandwidth memory (HBM) or the stacked memory structure, the error is an error occurring due to noise while data is transmitted through the TSV.

According to example embodiments, as illustrated in FIG. 23, the cell core ECC engine 622 may be included in the memory die, the via ECC engine 612 may be included in the buffer die 611. Accordingly, it may be possible to detect and correct soft data fail. The soft data fail may include a transmission error which is generated due to noise when data is transmitted through TSV lines.

Figure 25:
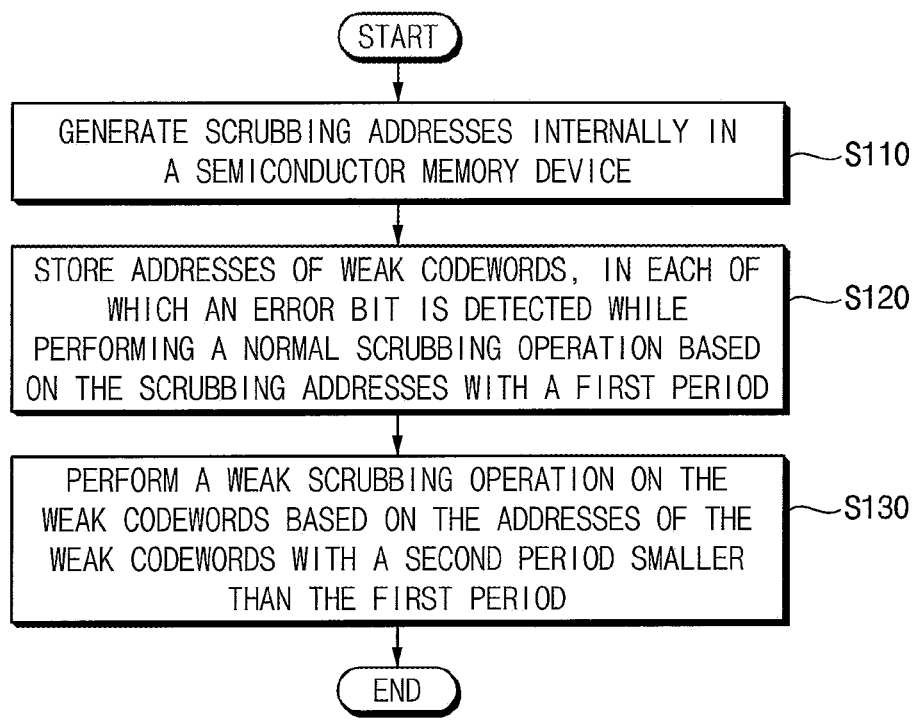
FIG. 25 is a flow chart illustrating a method of a semiconductor memory device according to example embodiments.

FIG. 25 is a flow chart illustrating a method of a semiconductor memory device according to example embodiments.

Referring to FIGS. 2 through 25, in a method of operating a semiconductor memory device 200 including a memory cell array 300 which may include a plurality of memory cell rows and each of the plurality of memory cell rows may include a plurality of volatile memory cells, a scrubbing control circuit 500 generates scrubbing addresses for performing a normal scrubbing operation on the memory cell rows based on refresh row addresses for refreshing the memory cell rows (operation S110).

An ECC engine 400 stores addresses of weak codewords in an address storing table of the scrubbing control circuit 500 while the ECC engine performs a normal scrubbing operation on the memory cell rows based on the scrubbing addresses with a first period (operation S120). An error bit is detected in each of the weak codewords during the normal scrubbing operation or normal read operation on at least one of the memory cell rows.

The ECC engine 400 performs a DAS operation on the weak codewords with a second period smaller than the first period based on a scrubbing operation on the weak codewords being dynamically within the refresh operation (operation S130).

Figure 26:
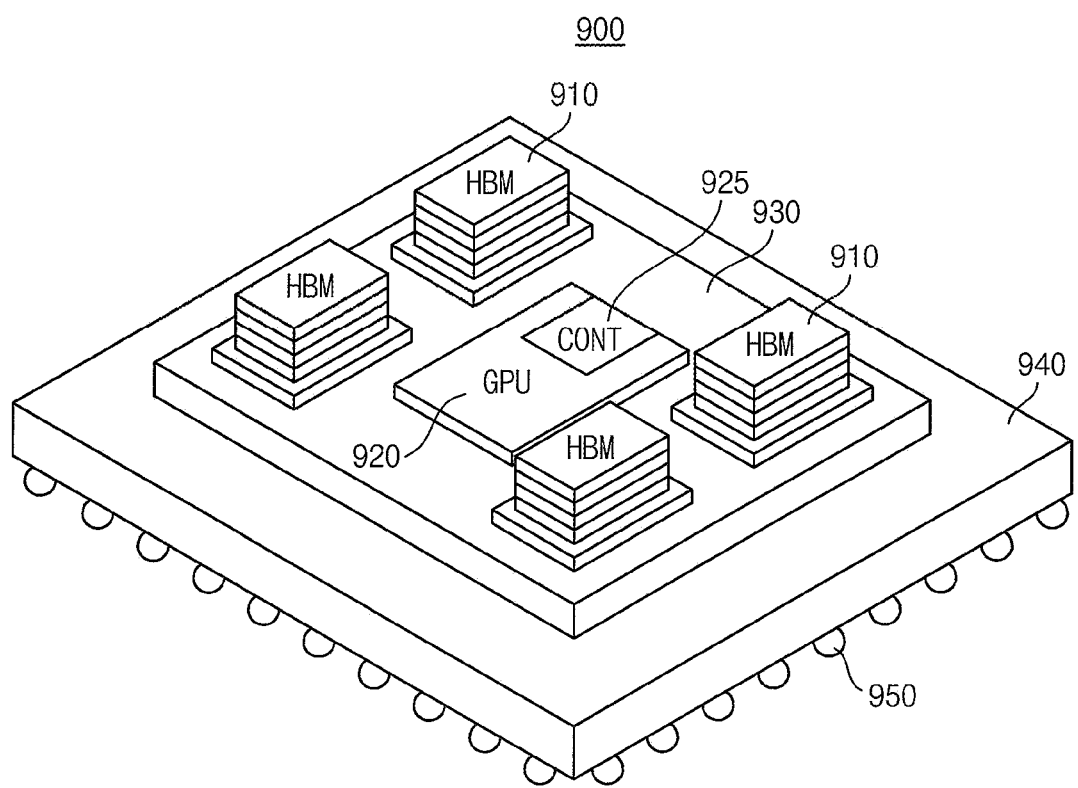
FIG. 26 is a diagram illustrating a semiconductor package including the stacked memory device, according to example embodiments.

FIG. 26 is a diagram illustrating a semiconductor package including the stacked memory device, according to example embodiments.

Referring to FIG. 26, a semiconductor package 900 may include one or more stacked memory devices 910 and/or a graphic processing unit (GPU) 920. The GPU 920 may include a memory controller 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include a memory cell array, an ECC engine and/or a scrubbing control circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the semiconductor memory device may include an ECC engine and a scrubbing control circuit. The ECC engine and the scrubbing control circuit perform a normal scrubbing operation within a first period on codewords in a memory cell row designated by a scrubbing address provided from the scrubbing control circuit whenever the refresh control circuit performs refresh operation on the memory cell rows N times.

In the normal scrubbing operation, the ECC engine corrects an error bit in a codeword and writes back the corrected codeword in a corresponding memory location and the ECC engine stores addresses of weak codewords in each of which an error bit is detected. The ECC engine and the scrubbing control circuit perform a DAS operation on the weak codewords with a second period smaller than the first period. Therefore, the semiconductor memory device may enhance credibility and/or performance by reducing or preventing error bits from being accumulated.

One or more of the elements disclosed above may include or be implemented in one or more processing circuitries, such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Aspects of the present inventive concepts may be applied to systems using semiconductor memory devices that employ an ECC engine. For example, aspects of the present inventive concepts may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A semiconductor memory device comprising:
a memory cell array including a plurality of memory cell rows, each of the plurality of memory cell rows including volatile memory cells;
an error correction code (ECC) engine;
a scrubbing control circuit configured to generate scrubbing addresses for performing a normal scrubbing operation on the plurality of memory cell rows with a first period based on refresh row addresses for refreshing the plurality of memory cell rows; and
a control logic circuit configured to control the ECC engine and the scrubbing control circuit to distribute a scrubbing operation on weak codewords dynamically within a refresh operation such that a dynamic allocated scrubbing (DAS) operation is performed with a second period, smaller than the first period,
wherein an error bit is detected in each of the weak codewords during the normal scrubbing operation or normal read operation on at least one of the plurality of memory cell rows.

2. The semiconductor memory device of claim 1, wherein the control logic circuit is configured to store addresses of the weak codewords in an address storing table in the scrubbing control circuit as weak codeword addresses, and is configured to provide the scrubbing control circuit with a flag signal that triggers the DAS operation.

3. The semiconductor memory device of claim 2, wherein the scrubbing control circuit includes:
a counter configured to count the refresh row addresses to generate an internal scrubbing signal, wherein the counter activates the internal scrubbing signal whenever the counter counts M refresh row addresses of the refresh row addresses, M being an integer greater than one;
a scrubbing address generator configured to generate a normal scrubbing address associated with the normal scrubbing operation for a first memory cell row selected from the memory cell rows in a first scrubbing mode, in response to the internal scrubbing signal and a scrubbing mode signal; and
a weak codeword address generator configured to generate a weak codeword address associated with a weak scrubbing operation associated with weak codewords in the first memory cell row in a second scrubbing mode, in response to the internal scrubbing signal and the scrubbing mode signal.

4. The semiconductor memory device of claim 3,
wherein the normal scrubbing address includes a scrubbing row address designating one memory cell row and a scrubbing column address designating one of codewords included in the one memory cell row, and
wherein the scrubbing address generator includes:
a page segment counter configured to increase the scrubbing column address by one during the internal scrubbing signal is activated; and
a row counter configured to increase the scrubbing column address by one whenever the scrubbing column address reaches a maximum value.

5. The semiconductor memory device of claim 3, wherein the weak codeword address generator includes:
an address storing table configured to store address information of the weak codewords; and
a table pointer configured to generate a pointer signal with the second period, which provides location information of the address storing table in response to the flag signal.

6. The semiconductor memory device of claim 5, wherein the address storing table is configured to output a row address and a column address of a weak codeword as a weak codeword row address and a weak codeword column address, which are stored in a corresponding location of the address storing table whenever the pointer signal is applied to the address storing table.

7. The semiconductor memory device of claim 1, wherein the control logic circuit is configured to control the ECC engine such that the ECC engine reads data corresponding to a first codeword, from at least one sub-page in a first memory cell row from the memory cell rows, corrects at least one error bit in the first codeword and writes back the corrected first codeword in a memory location corresponding to the at least one sub-page, in the normal scrubbing operation, and
wherein the control logic circuit is configured to control the ECC engine such that the ECC engine reads the weak codeword, from a weak sub-page, corrects at least one error bit in the weak codeword and writes back the corrected weak codeword in a memory location corresponding to the weak sub-page, in the DAS operation.

8. The semiconductor memory device of claim 7, furthering comprising:
a refresh control circuit configured to generate the refresh row addresses in response to an externally received first command,
wherein the scrubbing control circuit is configured to generate the scrubbing addresses whenever the scrubbing control circuit counts N refresh row addresses of the refresh row addresses, N being an integer greater than 3, and wherein the scrubbing control circuit is configured to sequentially generate scrubbing addresses designating M codewords included in a first memory cell row of the memory cell rows while a refresh operation is being performed on the first memory cell row, M being an integer greater than one and smaller than N.

9. The semiconductor memory device of claim 8, wherein the first command is a refresh command.

10. The semiconductor memory device of claim 7, wherein:
the ECC engine is configured to provide an error generation signal to the control logic circuit when the ECC engine detects at least one error bit in the first codeword;
the control logic circuit is configured to provide an address of the first codeword to the scrubbing control circuit as an error address; and
the scrubbing control circuit is configured to store the error address in an address storing table therein as a weak codeword address.

11. The semiconductor memory device of claim 10, wherein the control logic circuit is configured to provide an address of the memory cell row to the scrubbing control circuit as the error address when the ECC engine generates the error generation signal for the memory cell row more than a reference value.

12. The semiconductor memory device of claim 1, further comprising:
a victim address detector configured to count a number of accesses to a first memory region in the memory cell array to generate at least one victim address designating at least one adjacent memory region adjacent to the first memory region when the number of the counted accesses reaches a threshold value during a reference interval.

13. The semiconductor memory device of claim 12, wherein:
the victim address detector is configured to provide the at least one victim address to the scrubbing control circuit; and
the scrubbing control circuit is configured to store the at least one victim address in an address storing table therein as a weak codeword address.

14. The semiconductor memory device of claim 12, wherein:
the victim address detector is configured to provide the at least one victim address to a row decoder coupled to the memory cell array; and
the row decoder is configured to refresh the at least one adjacent memory region at least two times while the row decoder refreshes the memory cell rows once in response to the refresh row addresses and the at least one victim address.

15. The semiconductor memory device of claim 1, wherein:
the memory cell array includes a plurality of bank arrays;
the ECC engine includes a plurality of bank ECC engines corresponding to the plurality of bank arrays;
the scrubbing control circuit includes a plurality of bank scrubbing control circuits corresponding to the plurality of bank arrays; and
each of the plurality of bank ECC engines and each of the plurality of bank scrubbing control circuits are configured to perform the normal scrubbing operation and the DAS operation on respective one of the plurality of bank arrays independently from one another.

16. The semiconductor memory device of claim 15, wherein each of the plurality of bank ECC engines and each of the plurality of bank scrubbing control circuits are configured to selectively perform DAS operation based on whether the weak codeword is detected in the normal scrubbing operation.

17. The semiconductor memory device of claim 1, comprising:
at least one buffer die; and
a plurality of memory dies, the plurality of memory dies stacked on the at least one buffer die and conveying data through a plurality of through silicon via (TSV) lines,
wherein each of the plurality of memory dies includes the memory cell array and the scrubbing control circuit.

18. The semiconductor memory device of claim 17, wherein the semiconductor memory device is a high-bandwidth memory (HBM).

19. A method of operating a semiconductor memory device including a memory cell array that includes a plurality of memory cell rows, each of the plurality of memory cell rows including a plurality of volatile memory cells, the method comprising:
generating, by a scrubbing control circuit, scrubbing addresses for performing a normal scrubbing operation on the plurality of memory cell rows based on refresh row addresses for refreshing the plurality of memory cell rows;
storing, by an error correction code (ECC) engine, addresses of weak codewords in an address storing table of the scrubbing control circuit while the ECC engine performs a normal scrubbing operation on the plurality of memory cell rows based on the scrubbing addresses with a first period, an error bit being detected in each of the weak codewords during the normal scrubbing operation or normal read operation on at least one of the plurality of memory cell rows; and
performing, by the ECC engine, a dynamic allocated scrubbing (DAS) operation on the weak codewords with a second period, smaller than the first period based on a scrubbing operation on the weak codewords being dynamically within a refresh operation.

20. A semiconductor memory device comprising:
a memory cell array including a plurality of memory cell rows, each of the plurality of memory cell rows including volatile memory cells;
an error correction code (ECC) engine;
a refresh control circuit configured to generate refresh row addresses for refreshing the plurality of memory cell rows;
a scrubbing control circuit configured to generate scrubbing addresses for performing a normal scrubbing operation on the plurality of memory cell rows with a first period based on refresh row addresses; and
a control logic circuit configured to control the ECC engine and the scrubbing control circuit to distribute a scrubbing operation on weak codewords dynamically within a refresh operation such that a dynamic allocated scrubbing (DAS) operation is performed with a second period, smaller than the first period,
wherein an error bit is detected in each of the weak codewords during the normal scrubbing operation or normal read operation on at least one of the plurality of memory cell rows, and
wherein the control logic circuit is configured to store addresses of the weak codewords in an address storing table in the scrubbing control circuit as weak codeword addresses, and is configured to provide the scrubbing control circuit with a flag signal that triggers the DAS operation.

* * * * *